(12) United States Patent
van der Walde

(10) Patent No.: US 9,723,732 B2
(45) Date of Patent: Aug. 1, 2017

(54) SUSPENDED SEGMENTED DISPLAY ARRAY

(71) Applicant: Keith van der Walde, San Diego, CA (US)

(72) Inventor: Keith van der Walde, San Diego, CA (US)

( * ) Notice: Subject to any disclaimer, the term of this patent is extended or adjusted under 35 U.S.C. 154(b) by 0 days.

(21) Appl. No.: 15/064,382

(22) Filed: Mar. 8, 2016

(65) Prior Publication Data
US 2016/0192513 A1 Jun. 30, 2016

Related U.S. Application Data

(62) Division of application No. 13/656,663, filed on Oct. 20, 2012, now Pat. No. 9,311,836.

(60) Provisional application No. 61/550,369, filed on Oct. 21, 2011.

(51) Int. Cl.
*H05K 5/00* (2006.01)
*G09F 15/00* (2006.01)
*G06F 3/14* (2006.01)
*G09F 7/18* (2006.01)

(52) U.S. Cl.
CPC ......... *H05K 5/0017* (2013.01); *G06F 3/1446* (2013.01); *G09F 15/0006* (2013.01); *G09F 15/0018* (2013.01); *H05K 5/0021* (2013.01); *G09F 2007/1839* (2013.01)

(58) Field of Classification Search
CPC .................. G09F 15/0009; G09F 15/0018
See application file for complete search history.

(56) References Cited

U.S. PATENT DOCUMENTS

| | | | | |
|---|---|---|---|---|
| 1,089,916 A | * | 3/1914 | Fisher | G03D 13/10 396/652 |
| 1,127,676 A | * | 2/1915 | Ramm | A41F 11/04 24/346 |
| 2,366,695 A | * | 1/1945 | Bisheff | A47G 1/0622 24/332 |
| 3,853,226 A | | 12/1974 | Hine | |
| 4,497,125 A | | 2/1985 | Hutchinson | |
| 4,577,444 A | | 3/1986 | Sanderson | |
| 4,897,944 A | * | 2/1990 | Otake | G03B 27/46 40/704 |
| 5,090,145 A | | 2/1992 | Chiang | |
| 5,342,014 A | * | 8/1994 | Wilson | A47G 1/1613 248/476 |

(Continued)

OTHER PUBLICATIONS

Art Trac cable suspension product by Griplock Systems, Inc of Carpentaria, CA. Links provided below; last visited Nov. 7, 2012. (pdf printout of below website content submitted herein as: 1_Griplock_art_track.pdf) http://www.griplocksystems.com/artsuspension/detail.cfm?Art-Track&id=344&cat=8 http://www.griplocksystems.com/product_specsheets/ART-TRAC.PDF http://www.griplocksystems.com/guidelines/Double%20Art-Track%20System.pdf.

(Continued)

*Primary Examiner* — Gary C Hoge

(57) ABSTRACT

A suspended segmented display array in one embodiment includes multiple cables offset from a wall via standoff members. Adjacent display panels attach to cables via finger releasable clamps and present varied and unique visual displays. A versatile and cost-effective display system thus is established that accommodates a wide range of content which can readily be changed out.

23 Claims, 41 Drawing Sheets

(56) References Cited

U.S. PATENT DOCUMENTS

| | | | |
|---|---|---|---|
| 6,212,810 B1 * | 4/2001 | Jones | G09F 15/0037 160/135 |
| 6,256,109 B1 | 7/2001 | Rosenbaum | |
| 6,820,853 B1 | 11/2004 | DuBarry | |
| 7,086,190 B2 | 8/2006 | Voluckas | |
| 7,841,115 B2 * | 11/2010 | Saunders-Singer | A47F 7/146 40/600 |
| 7,934,331 B2 | 5/2011 | Zlotocha | |
| 2004/0026593 A1 | 2/2004 | Fay | |
| 2005/0001136 A1 * | 1/2005 | Fleishman | A47G 1/1686 248/489 |
| 2005/0155268 A1 * | 7/2005 | Engelhardt | A47G 1/065 40/772 |
| 2005/0193610 A1 * | 9/2005 | Rost | G09F 7/12 40/654.01 |
| 2006/0201039 A1 * | 9/2006 | Gilliland | A47G 1/065 40/605 |
| 2008/0276510 A1 * | 11/2008 | Harris | G09F 7/12 40/594 |
| 2009/0139127 A1 * | 6/2009 | Southard | A47G 1/065 40/761 |
| 2011/0101187 A1 | 5/2011 | Shaha | |
| 2011/0113661 A1 * | 5/2011 | Pemberton | G09F 7/04 40/541 |
| 2013/0269229 A1 * | 10/2013 | Rodriguez-Aparicio, Sr. | G09F 7/18 40/600 |

OTHER PUBLICATIONS

Wall mounted sign system by Griplock Systems, Inc of Carpentaria, CA. Links provided below; last visited Nov. 7, 2012. (pdf printout of below website content submitted herein as: 2_Griplock_Wall-Mounted_Signage.pdf) http://www.griplocksystems.com/guidelines/Wall-Mounted%202-Cable%20Signage%20w.%20Stand-Off%20Mounts%20&%20Anchor%20Plates..PDF http://www.griplocksystems.com/product_specsheets/DG-25-SOM-SAT.PDF.

IXXI Company product; links provided below; last visited Nov. 7, 2012. (pdf printout of below website content submitted herein as: 3_ixxi.pdf) http://www.ixxidesign.com http://www.ixxidesign.com/en/categorien/3-ixxi-tools.html.

Modern Mural, LLC as seen at www.modernmural.com. (pdf printout of sample website content extracted on Feb. 23, 2011 submitted herein as: 4_modernmural.pdf).

Discount Displays (UK); links provided below. Last visited on respective dates of Feb. 23, 2011 and Nov. 7, 2012 (pdf printout of below website content submitted herein as: 5_discount_display.pdf) http://www.discountdisplays.co.uk http://www.discountdisplays.co.uk/html/display-cable-system-window-cable-display-system.html.

* cited by examiner

108

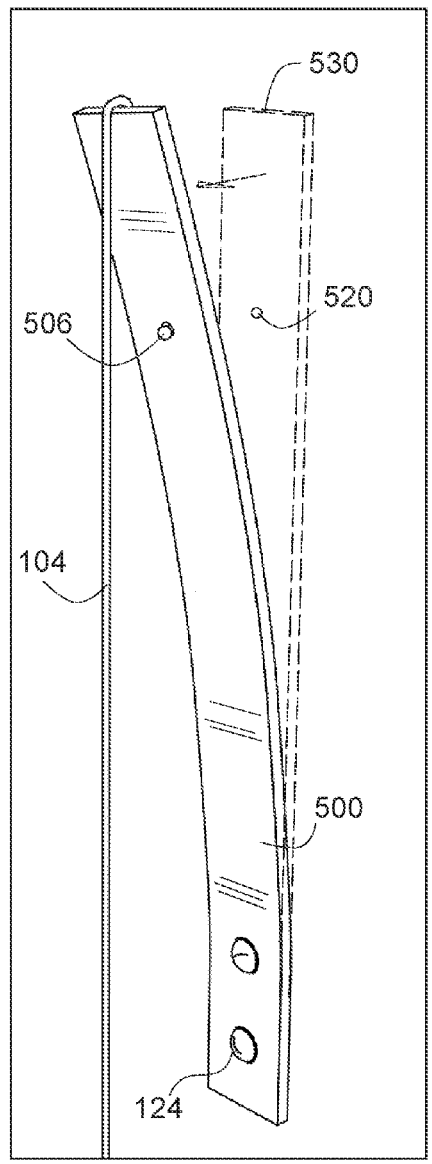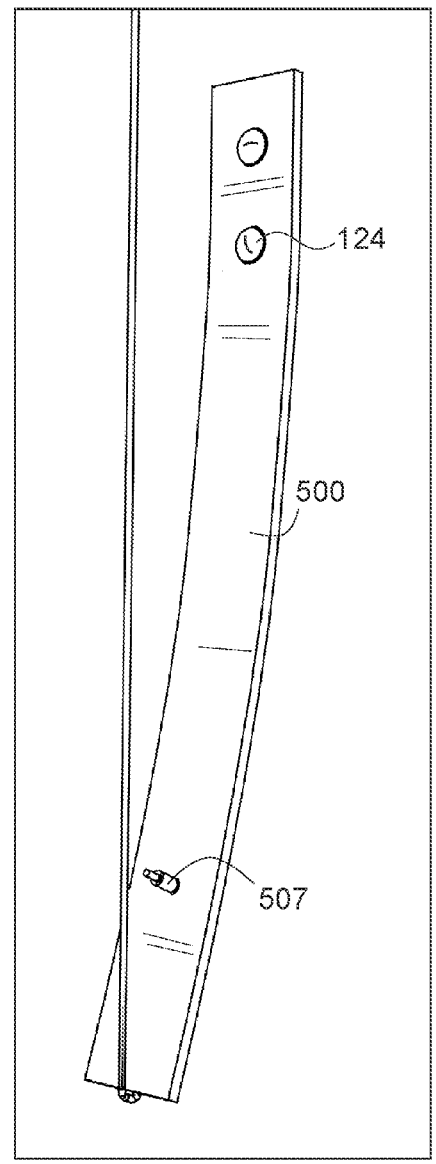
FIG. 30a                    FIG. 30b ical Patent Application Ser. No. 61/550,369 filed Oct. 21, 2011 by the present inventor, which is herein incorporated by reference.

SUSPENDED SEGMENTED DISPLAY ARRAY

REFERENCE TO RELATED APPLICATIONS

This is a division of U.S. patent application Ser. No. 13/656,663 filed Oct. 20, 2012 by the present inventor, which is herein incorporated by reference. U.S. patent application Ser. No. 13/656,663 claims the benefit of priority under 35 U.S.C. §119(e) to U.S. Provisional Patent Application No. 61/550,369 filed Oct. 21, 2011 by the present inventor, which is herein incorporated by reference.

FIELD OF INVENTION

The present invention generally relates to display devices, and more particularly to a display system for presenting segmented panels on or near walls or other building surfaces. Such a system has multiple uses, including decorative capacities, especially facilitated when the panels themselves are artwork, photographs, ornate materials, or other decorative media.

BACKGROUND

The prior art shows examples of display systems that facilitate the presentation of panel arrays. For example, U.S. Pat. No. 7,934,331 to Zlotocha, provides a system for presenting arrays of photographs and the like using wall-mounted structural component assemblies. U.S. Pat. No. 7,086,190 to Voluckas also allows for the presentation of planar visuals, where components such as elastic cord, slotted tubular members, floor anchors, and different cord interfaces are used for this purpose. Cord is also used in the wall hanging device provided by U.S. Pat. No. 6,820,853 to DuBarry, which uses a mounting structure fixably attached to a wall below which multiple display items are hung. U.S. Pat. No. 4,897,944 to Otake et al. discloses a print holder in which a plurality of pockets or open-ended envelopes are intended to hold elemental prints that are part of a larger main image.

Additional examples of previous panel array products include the display system by Griplock Systems, Inc of Carpentaria, Calif. sold under the trade name "Art Track" which is representative of a broader class of commercial display products where two opposing long, thin wall-mounted members support a plurality of parallel cables to which display items are mounted.

Several of the prior art systems listed above, however, are quite hardware-intensive, making use of long, bulky, or numerous parts. This results in greater expense in manufacturing and shipping. The visual prominence associated with bulky hardware is generally not desirable given that one of the central purposes of these products is to present art or other visual media. Complexity is also a common drawback in one or more of the referenced prior art examples, correspondingly relating to higher cost and more substantial installation effort with greater likelihood for errors. Several of these systems further suffer from lack of versatility pertaining to their inability to accommodate different panel types and sizes. Several of these systems further present impediments to ready panel change-out, therefore negatively impacting the usability of the systems.

SUMMARY

Various selected embodiments are herein disclosed for a segmented display array in summary form. In accordance with one embodiment, a segmented display array comprises suspended elongated member segments, composed of, for example, cable or cord, that are routed to substantially lie within a plane. Standoff members, that are attached to a wall or other building surface, serve the purpose of securing these elongated member segments in position. Display panels, such as mounted photos or graphics, are directly coupled to the elongated member segments using releasable clamps. Two elongated member segments are generally associated with each display panel, and one or more clamps are generally used to grip the regions in which these parts make contact, affording stability to the assembly. Such a display array allows for highly versatile usage, where a broad range of display panel types and sizes can be used for a given hardware installation. For example, mounted art prints can be secured to this system, as can translucent acrylic sheets, or elements of a collage of varying size. Also, display panel change-out is well facilitated.

In another embodiment, a segmented display array comprises suspended elongated member segments, composed of, for example, cable, that are routed to substantially lie within a plane. Standoff members, that are attached to a wall or other building surface, serve the purpose of securing these elongated member segments in position. Display panels, such as mounted photos or graphics, are releasably coupled to the elongated member segments using permanent magnets, making for a changeable display in which the display panel fastening means (the magnets) are not visible from the front. Using a ferromagnetic material for the elongated member segments, and adhering magnets to the back of the display panels provides a simple and versatile implementation on this embodiment.

Finally, in accordance with a third embodiment, a segmented display array comprises suspended elongated member segments, composed of, for example, cable or cord, that are routed to substantially lie within a plane. Standoff members, that are attached to a wall or other building surface, serve the purpose of securing these elongated member segments in position. Display panels, such as mounted photos or graphics, are securely coupled on their back sides to clamps with extended stable grip regions. These clamps releasably clamp to the elongated member segments, affording the system stability and adjustability, yet hiding the clamps from the viewer Like the other embodiments, simplicity here makes for enhanced functionality and versatility, as will be seen in greater detail.

Thus several advantages of one or more aspects are that the segmented display array uses hardware (such as cables directly connected to standoff members and low- or no-visibility panel mounting means) that is compact and minimal, making for cost and shipping advantages, as well as minimized hardware visual prominence. Other advantages of one or more aspects are that the segmented display array complexity is low, providing cost savings and further reducing the installation effort and possibilities of mistakes/malfunctions associated with many unique parts. Other advantages of one or more aspects are that the segmented display array has a high level of versatility; for example, different sized panels can be accommodated on one or more embodiments, as can panels of different material types, and panels can readily be changed out.

This summary is provided to introduce a selection of concepts in a simplified form that, along with additional concepts, are described in further detail in the detailed description and drawings contained herein. This summary is not intended to identify key features or essential features of the claimed subject matter, nor is it intended to be used as an aid in determining the scope of the claimed subject matter. Yet other concepts, forms, embodiments, advantages, benefits, features, and aspects of the present invention will become apparent from the detailed description and drawings contained herein, as well as from the claims.

BRIEF DESCRIPTION OF THE DRAWINGS

FIGS. 30a,b are front perspective close up views of the top and bottom respective flexible standoff members used in the display array embodiment of FIG. 28.

DETAILED DESCRIPTION OF SELECTED EMBODIMENTS

Figure 1:
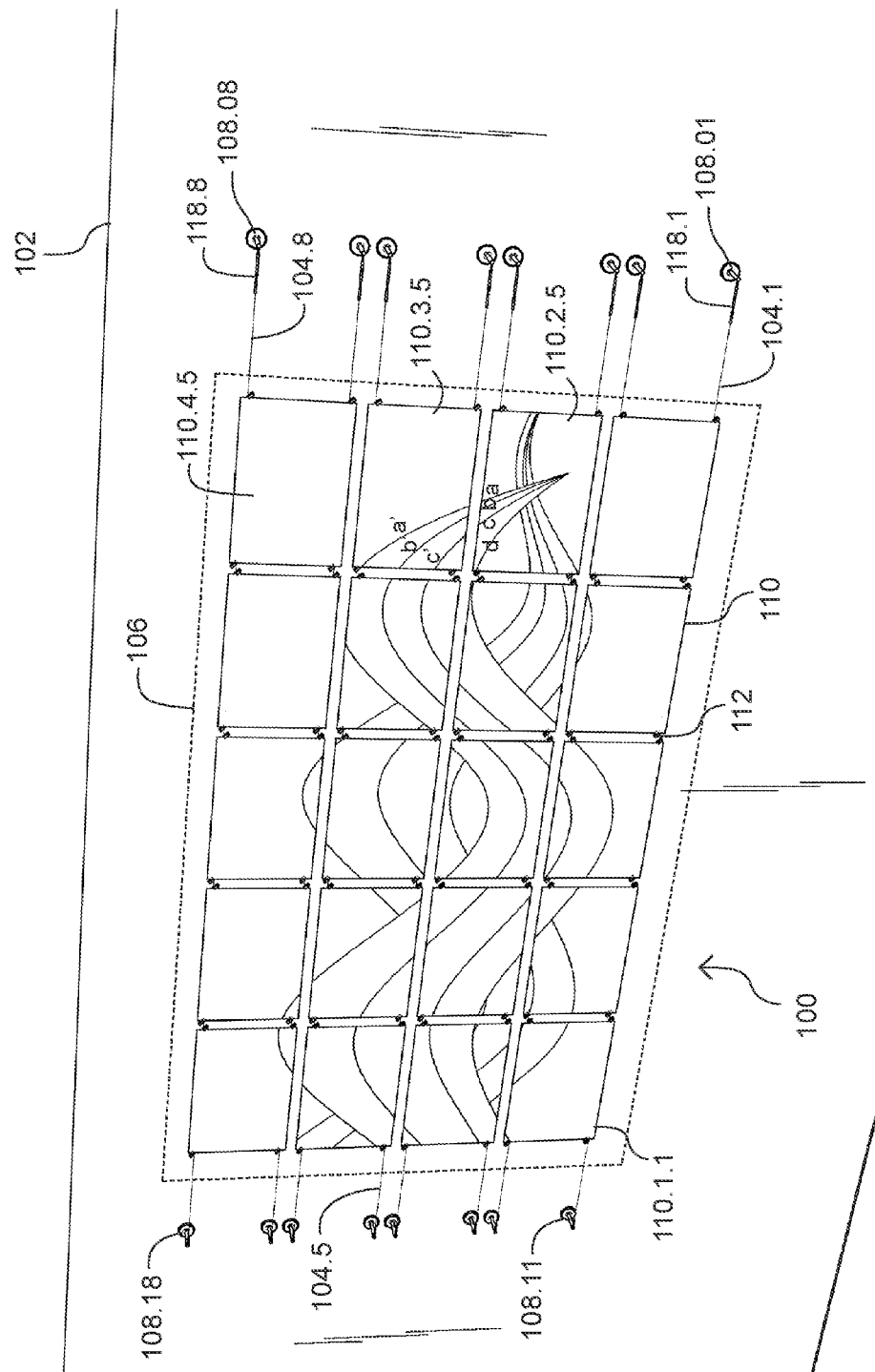
FIG. 1 is a front perspective view of a segmented display array in accordance with one embodiment.

For the purposes of promoting and understanding the principles of the present invention, reference will now be made to the embodiments illustrated in the drawings and specific language will be used to describe the same. It will nevertheless be understood that no limitation of the scope of the invention is thereby intended. Alterations and further modification in the described embodiments, and further applications of the principles of the invention as described herein are contemplated as would normally occur to one skilled in the art to which the invention relates.

As used herein, the terms "comprises," "comprising," "includes," "including,", "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive "or" and not to an exclusive "or." For example, a condition A or B is satisfied by any one of the following: A is true and B is false, A is false and B is true, and both A and B are true.

Also, use of the words "a" or "an" are employed to describe elements and components of the invention. This is done merely for convenience and to give a general sense of the invention. This description should be read to include one or at least one and the singular also includes the plural unless it is obvious that it is meant otherwise.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "suspended segmented display array" or simply "segmented display array" are used throughout. In this context, consistent with the teachings of the present specification, "segmented" is understood to be two or more parts that collectively form a whole, and not just being an original whole that is broken into parts. Further, the term "array" is understood to be in reference to an arrangement of elements that might be regular (i.e. with uniform rows and columns) or irregular (no organization at all).

Embodiment Including Direct Panel Clamping

In accordance with one embodiment of the segmented display array, FIG. 1 shows a segmented display array 100 composed of elongated member segments 104 that can individually more precisely be identified as 104.1-104.8 (ordered bottom to top in FIG. 1) that are horizontally-suspended substantially within a plane 106. These elongated member segments 104 are made of cable in this embodiment, but other materials or components are suitable such as wire, rope, thread, string, cord, monofilament, tubing, bars, and rods. Standoff members 108 hold the cables in place. The standoff members 108 can more precisely individually be identified as 108.01-108.08 (ordered bottom to top in FIG. 1) connected to one end of the elongated member segments 104 and as 108.11-108.18 (also bottom to top) connected to the other ends, respectively. These standoffs 108 in turn mount to a building surface 102, which could be a wall, ceiling, or floor, and could be on the interior or exterior of a building. Display panels 110 are releasably coupled directly to adjacent elongated member segments 104 via clamps 112. Each display panel in the array can be more precisely defined by a respective row decimal and a column decimal, with the 20 panels ranging from 110.1.1 to 110.4.5. The clamps 112 are akin to alligator clips which have elastically coupled opposing halves that can be operated by finger pressure. Other such finger-releasable clamps that would occur to those skilled in the art could also be used, as could clamps that have locks on them to serve as theft deterrents for the display panels 110. This embodiment is noted to have two elongated member segments 104 per display panel row. Tension is generated in these elongated member segments 104.1-104.8 using length adjustment members 118, which more specifically include 118.1-118.8 which most preferably are turnbuckles but other components such as springs could be used for this purpose.

Figure 2:
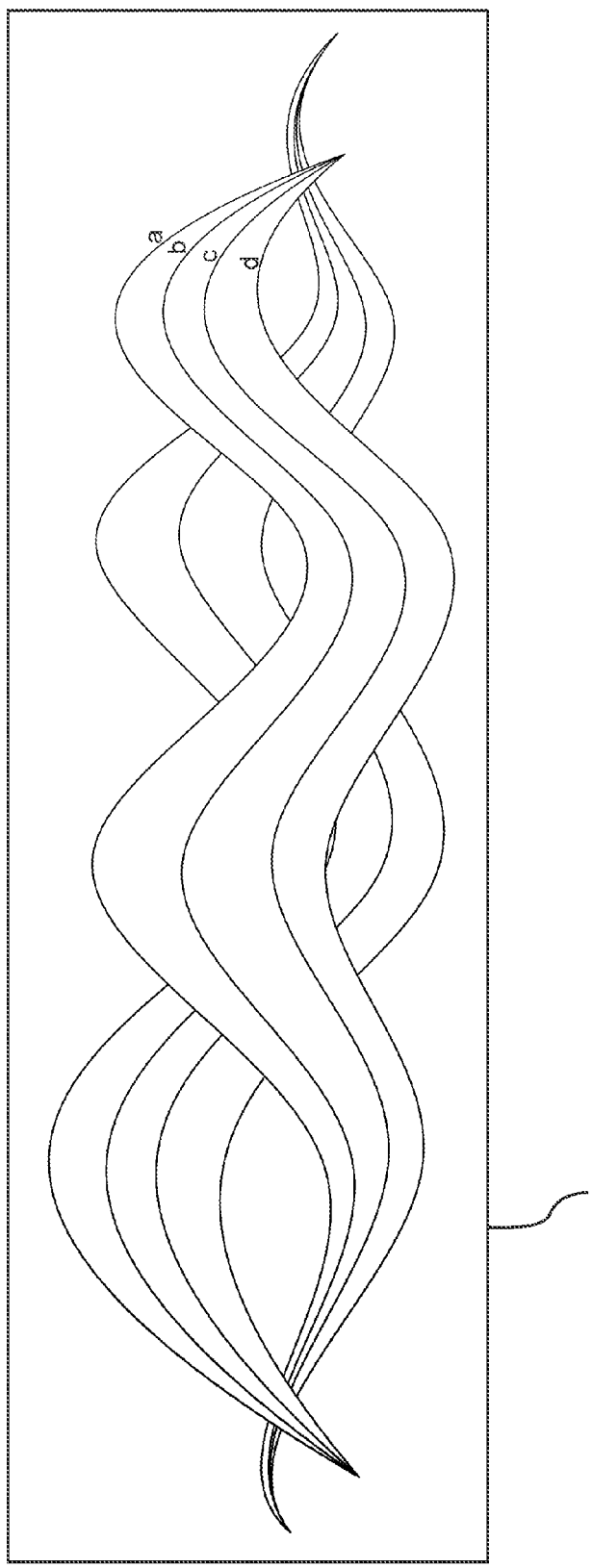
FIG. 2 shows the larger coherent image corresponding to the image displayed in FIG. 1.

Still referring to FIG. 1, various display panels 110 have images different than several other of the display panels 110, but together they form a part of a larger coherent image 116, as shown in FIG. 2. For example, referring back to FIG. 1, display panel 110.2.5 displays curved lines a, b, c, and d coming to a point, and display panel 110.3.5 just above it includes curved extension portions a', b' and c' of three of those lines a, b and c, respectively. This larger coherent image 116 is thus visible in its segmented form in FIG. 1 which compares to the corresponding image in its full, continuous state in FIG. 2.

Figure 3:
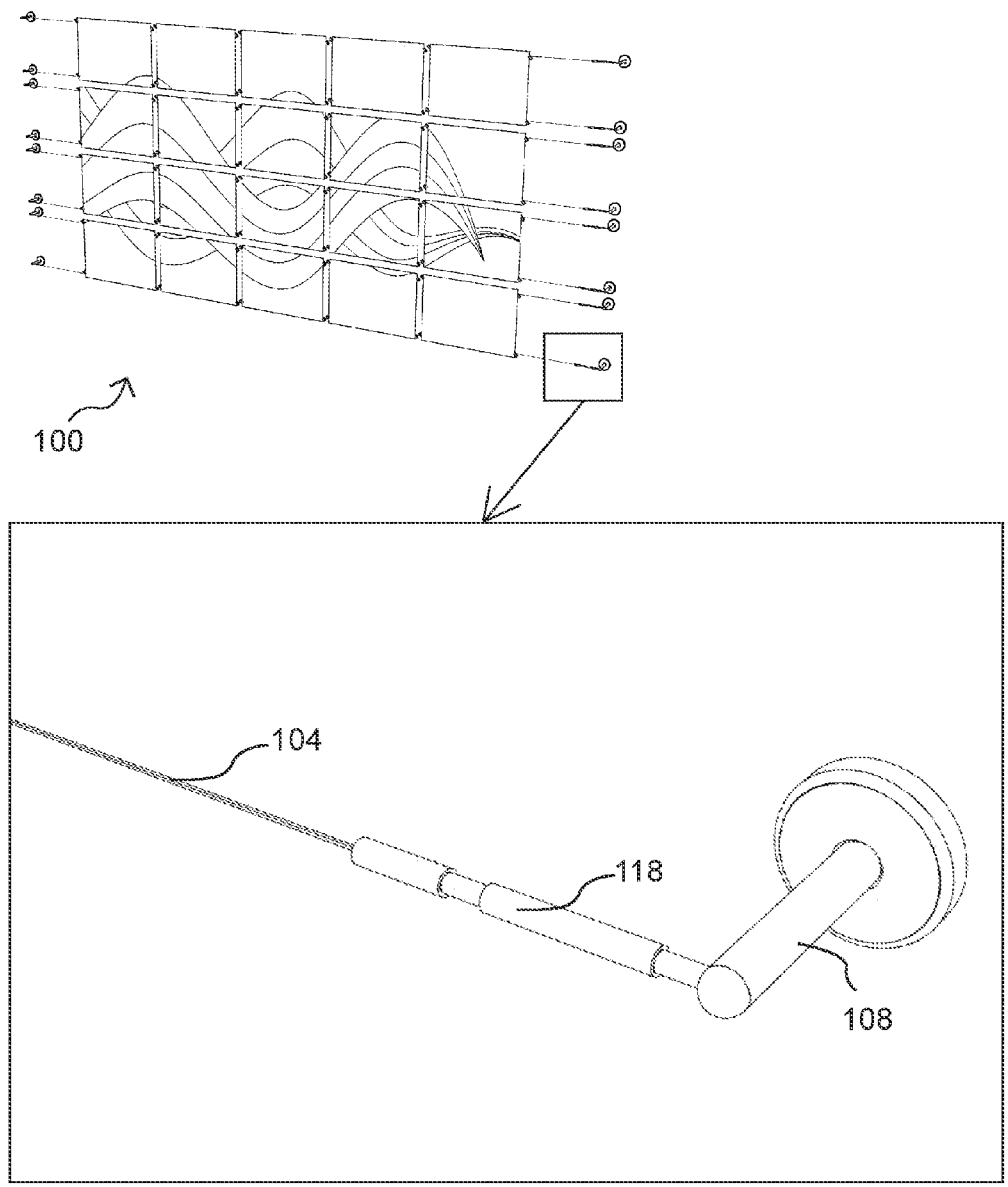
FIG. 3 is a front perspective close up view of a portion of FIG. 1 showing a standoff member and length adjustable member.
Figure 4:
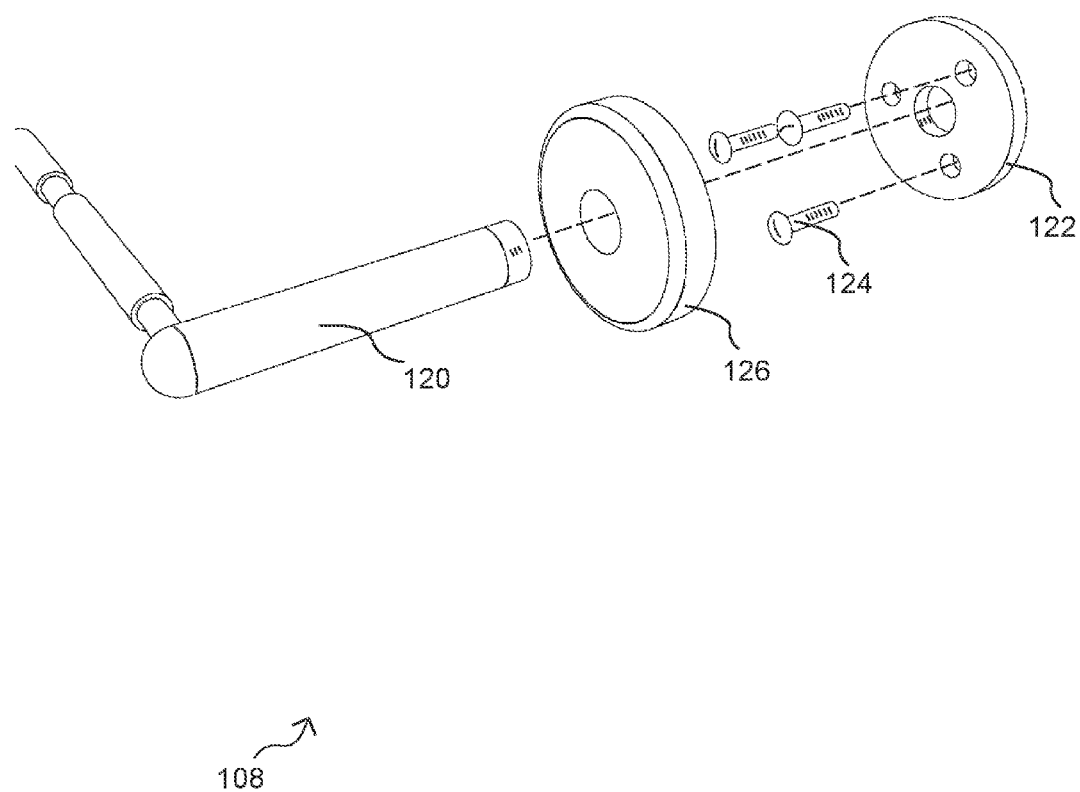
FIG. 4 is a front perspective exploded view of a standoff member from FIG. 1 and the associated mounting hardware.

A closer view of a typical standoff member 108 is shown in FIG. 3. Here the length adjustable member 118 is also shown and is seen to be attached to the elongated member segment 104. The standoff member 108 is attached to the building surface 102 (FIG. 1) using the fasteners and installation methodology appropriate to the building surface 102 at hand, as can be ascertained by one skilled in the art. By way of illustrative example, the standoff member 108 of FIG. 3 is shown in exploded view in FIG. 4, where the standoff member shank 120 is seen to thread into the standoff member mount plate 122 which is secured to the building surface 102 with the building surface mounting fasteners 124. Drywall toggle fasteners (not shown) that are widely available may, for example, thread onto the other end of these fasteners 124 where they extend through holes in an exemplary wall. The standoff member mount plate cover 126 hides the building surface mounting fasteners 124 screw heads.

Figure 5:
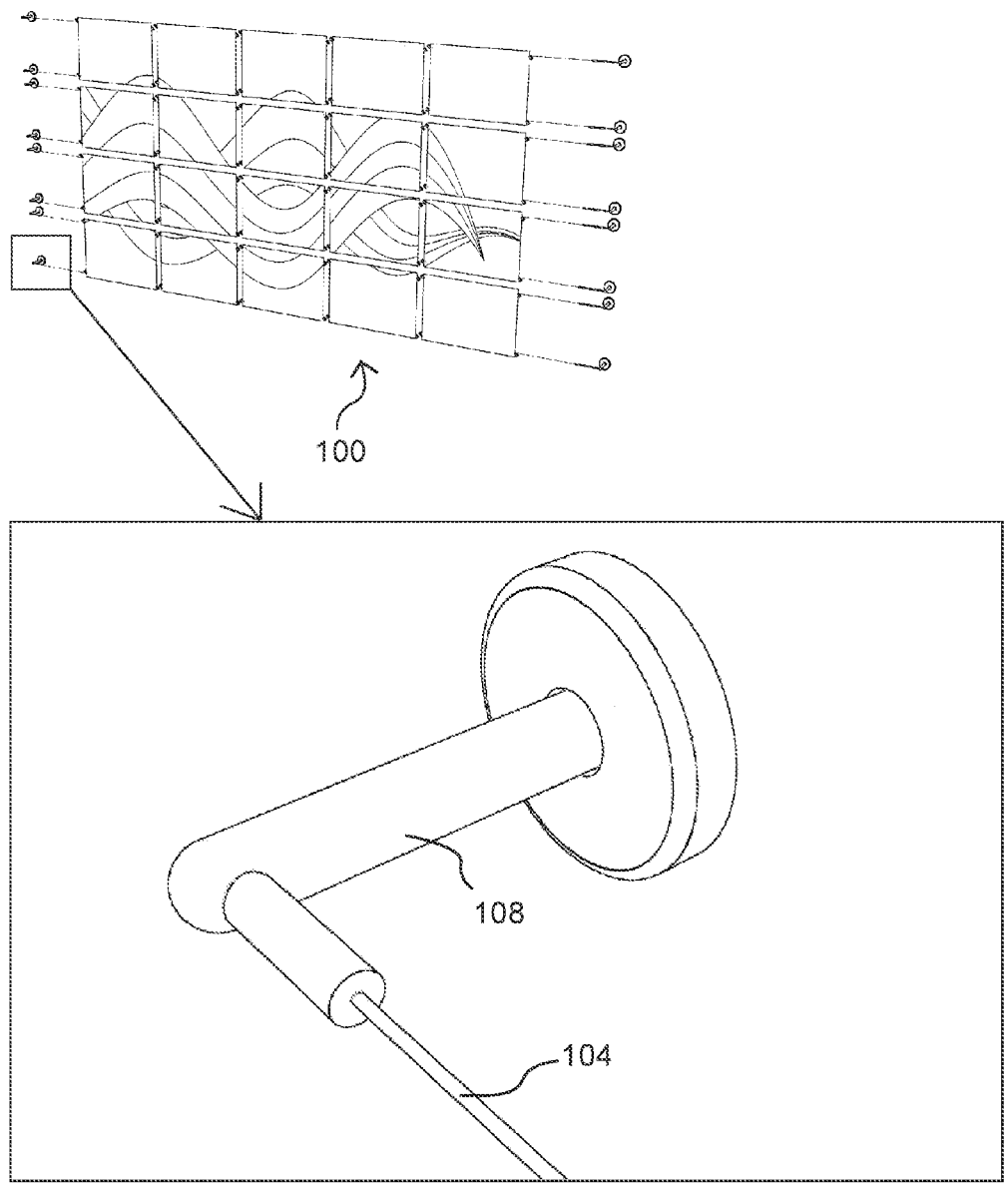
FIG. 5 is a front perspective close up view of a portion of FIG. 1 showing a standoff member receiving an elongated member segment.

An opposing standoff member 108 that receives the other end of the elongated member segment is shown in FIG. 5. This is seen to be equivalent to the standoff member 108 shown in FIG. 3, but without the length adjustment member 118. These standoffs 108 are representative of any mechanical element capable of suspending elongated member segments from a wall, and can accordingly be rods, threaded fasteners, eyelets, wooden blocks, etc. A great many commercially available special purpose standoffs can be found on the market that are suitable for direct application here.

Figure 6:
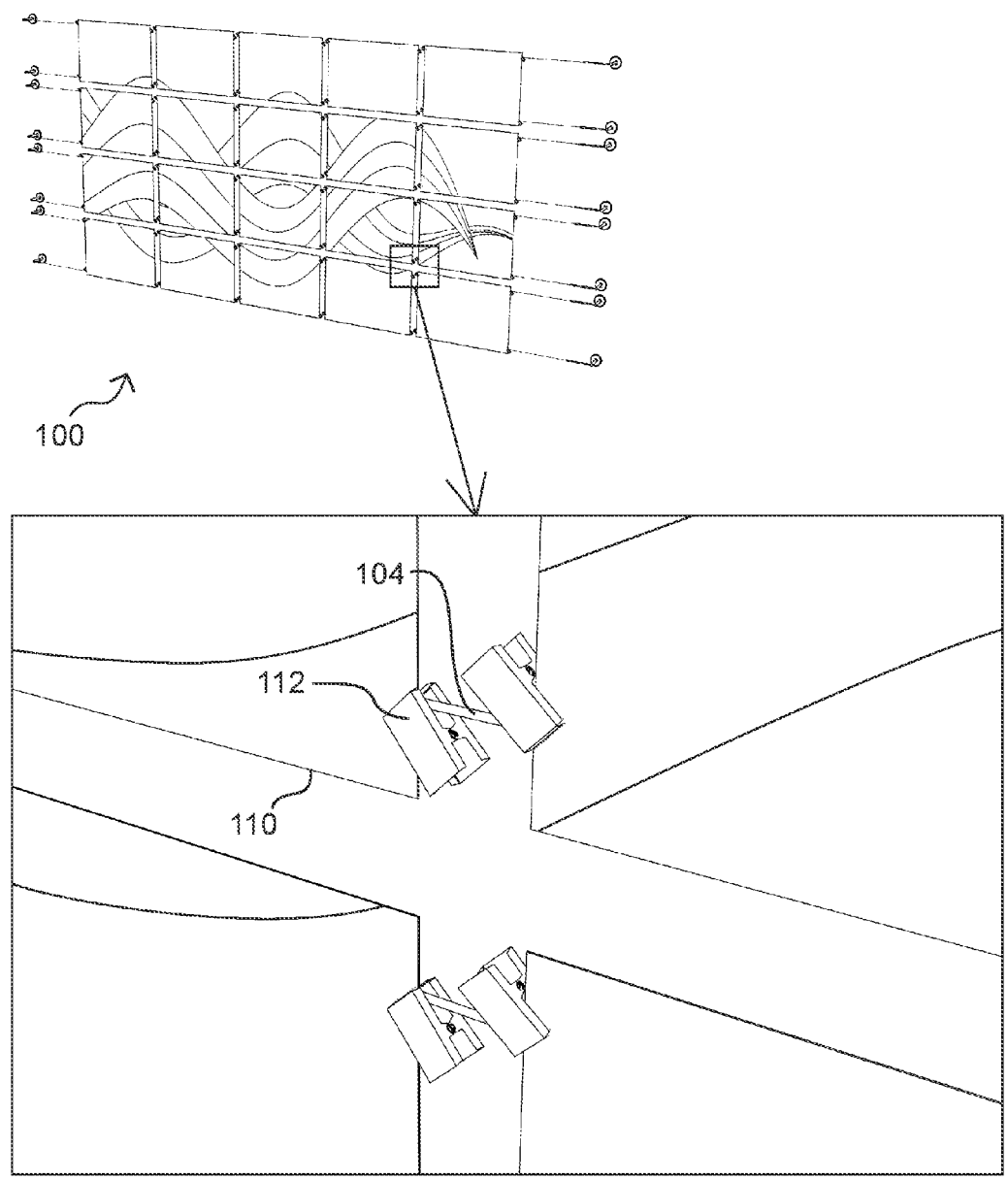
FIG. 6 is a front perspective close up view of a portion of FIG. 1 showing how the display panels are clamped to the elongated member segments.
Figure 7:
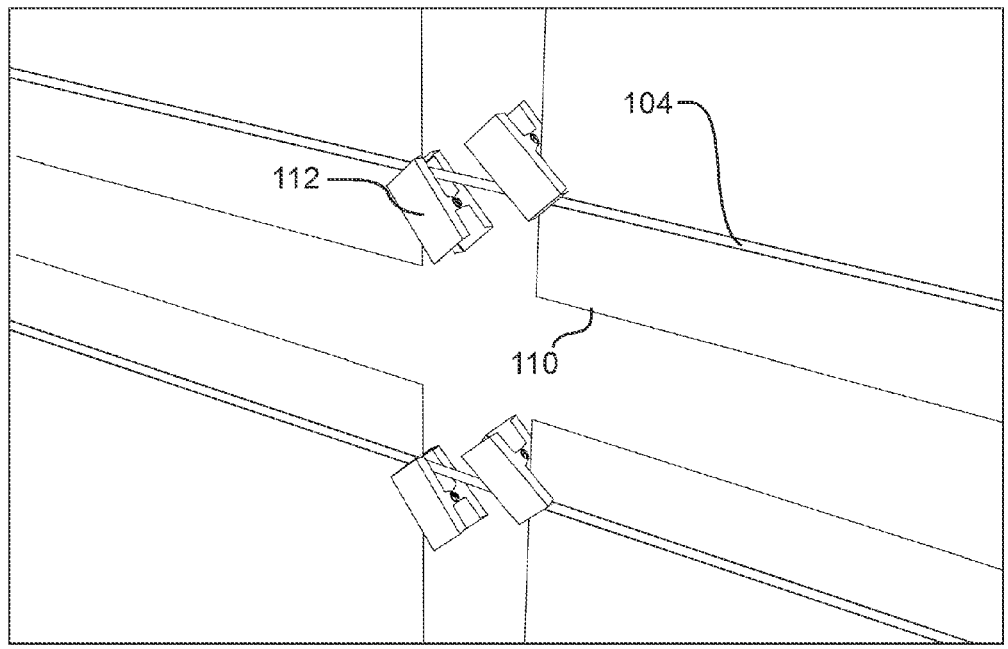
FIG. 7 is a perspective close up view of the back of the region shown in FIG. 6 showing how the display panels are clamped to the elongated member segments.

FIG. 6 shows a close-up of several display panels 110, adjacent elongated member segments 104, and the clamps 112 that directly couple the segments and panels to each other. A back side view of this region is shown in FIG. 7 where the elongated member segments 104 can be seen running adjacent to (and behind) display panels 110.

Construction of the embodiment of the segmented display array shown in FIG. 1 is achieved by measuring and marking the building surface 102 with locations for mounting of the standoff members 108, and then mounting the standoff members 108 to the building surface 102. Next the length adjustment members 118 are attached to the standoff members 108 (FIG. 3). It is noted that standoff members 108 with integrated length adjustment members 118 are widely available. With these components in place, each elongated member segment 104 is routed between its corresponding length adjustment member 118 and the opposing standoff member 108, and the length adjustment member is used to make the elongated member segment 104 taut. For example, elongated member segment 104.1 is routed between length adjustment member 118.1 (attached to standoff member 108.01) and the opposing standoff member 108.11, and the length adjustment member 118.1 is used to make the elongated member segment 104.1 taut. Display panels 110, by way of non-limiting example, are cardstock prints produced from a larger coherent image 116 that was tiled in, for example, a digital image editing program such as Adobe Photoshop. The display panels 110 are positioned by measurement and manual alignment with the grid established by the elongated member segments 104. Once in position, a given display panel is held in place by one hand of the installer, and the other hand applies clamps 112 in the manner depicted in FIGS. 6 and 7. For ease of assembly, the display panels 110 can include markings (not shown) on their rear faces of their matrix positions to allow ready positioning of the panels in proper order.

It is noted that this exemplary segmented display array achieves a unique and aesthetically pleasing effect with very simple hardware and makes for an adaptive and economical platform for which display panel content 110 can be readily changed out without tools, and collages, for example, can be created. It is noted that the same hardware can be used to present display panels 110 of varying sizes; these panels 110 simply need to be sufficiently adjacent to elongated member segments 104 to allow clamping.

Embodiment Including Compression Members

Figure 8:
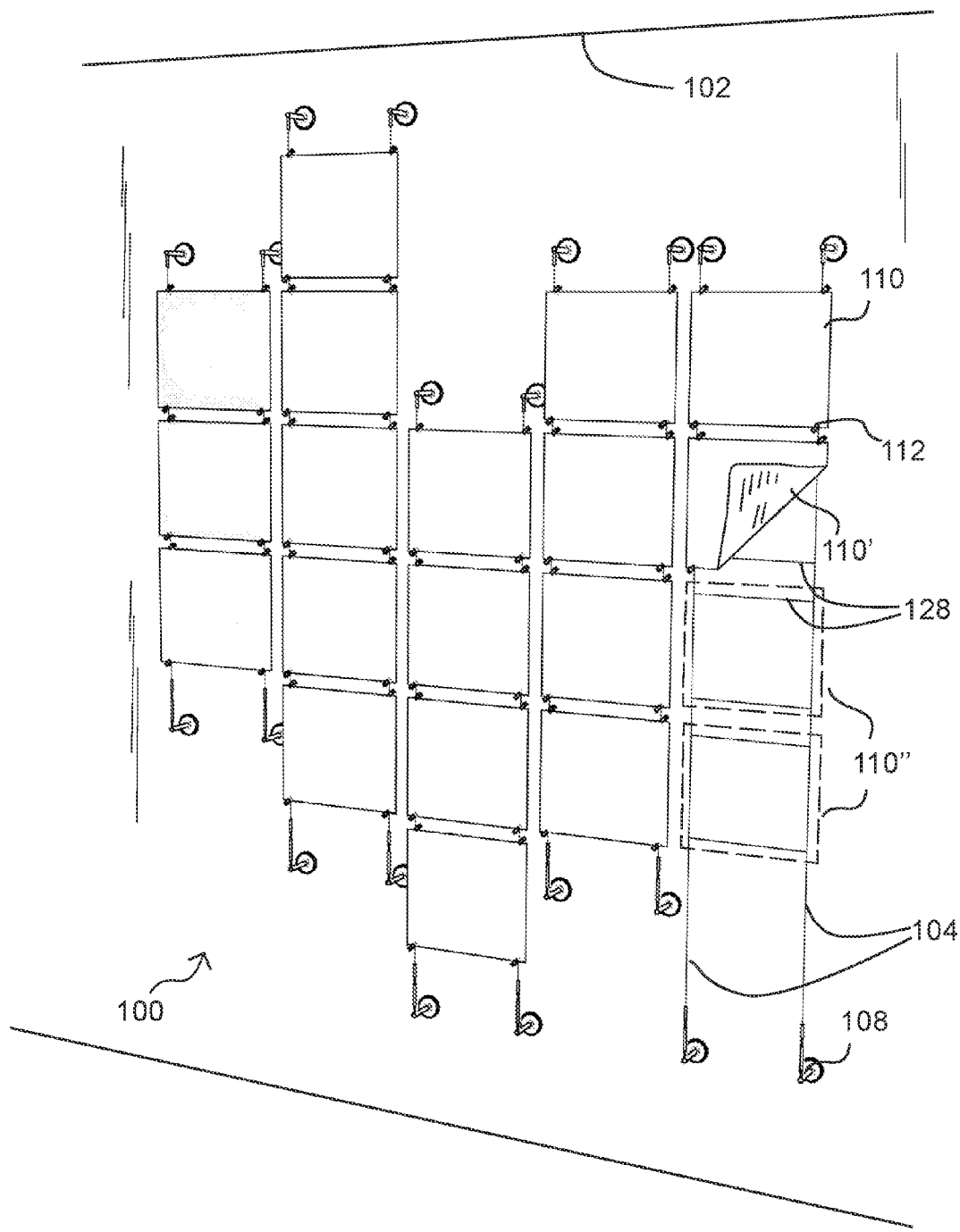
FIG. 8 is a front perspective view of a segmented display array in accordance with another embodiment that uses compressive members.
Figure 9:
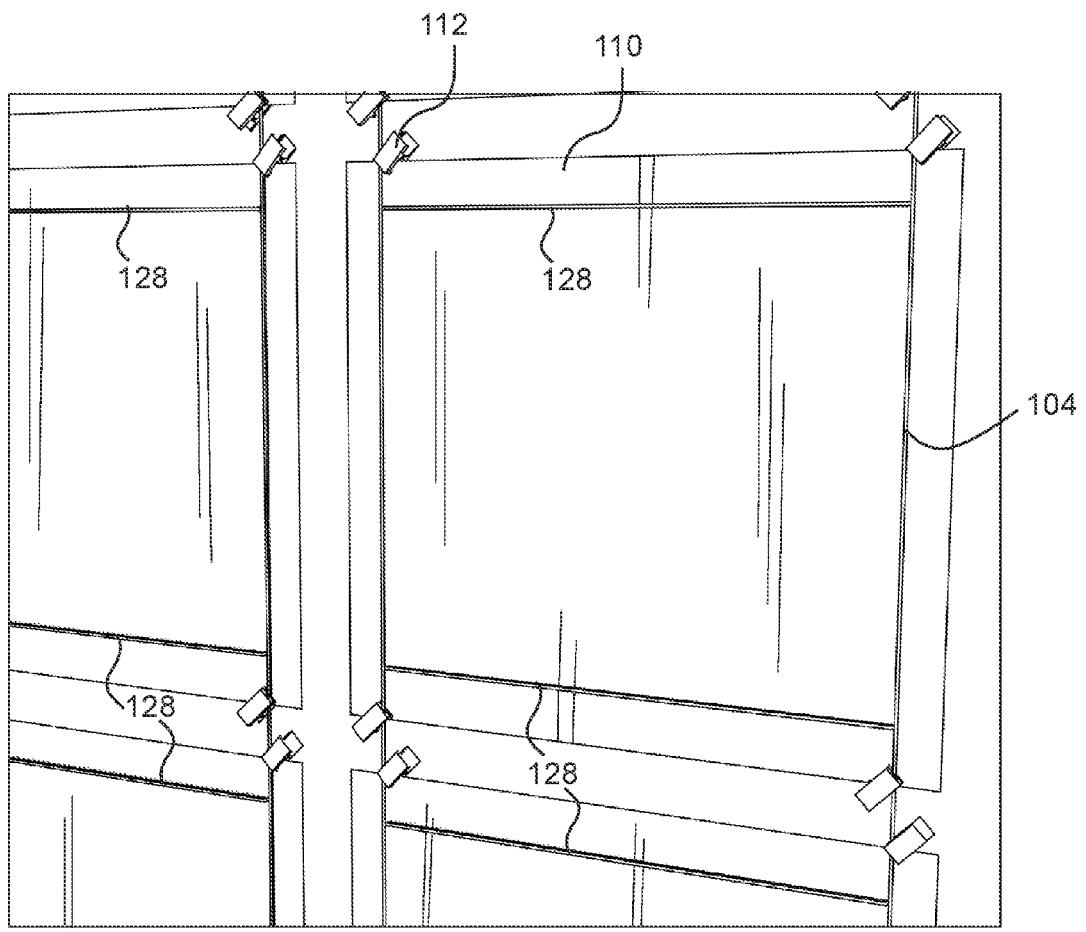
FIG. 9 is a back perspective close up view of several display panels shown in FIG. 8.

In accordance with another embodiment of the segmented display array, FIG. 8 shows a segmented display array in which elongated member segments 104 that are flexible are vertically suspended off a building surface 102 with standoff members 108. Here the display panels 110 are understood to be flexible, as depicted by 110'. Such exemplary display panel material includes fabric, paper, and thin plastic. In order to apply tension to such a flexible display panel 110, thin and light compression members 128 are inserted between the flexible elongated member segments 104. One such compression member 128 is shown in FIG. 8 in the region where 110' is depicted as raised. Each end of the compression member 128 is preferably concavely shaped to more stably engage the elongated member segments 104 when they have a round cross section, such as with cable. Four other compression members 128 are shown underneath the two display panels 110" (depicted as transparent for clarity). The compression members 128 are thin, lightweight members capable of supporting light compressive loads (balsa wood of rectangular cross section, for example, has been found to work well); they are positioned where a flexible display panel 110 is to be installed (flexible elongated member segment 104 laterally-induced force keeps them in position) and then the flexible display panel 110 is secured via clamps 112 at the adjacent flexible elongated member segments 104 in such a way that the flexible display panel 110 is loaded in tension (i.e. is taut), and the compression members 128 are loaded compressively. FIG. 9 shows the back side of several of the display panels 110 of FIG. 8, and the associated compression members 128. Here two compression members 128 are used for each display panel 110, but one centered compression member 128 has also been found to work well.

In the absence of these compression members 128, the flexible elongated member segments 104 would simply laterally deflect with respect to one another when an installer attempts to load a flexible display panel 110 in tension (i.e. make it taut). While this is permissible if just one flexible display panel 110 is associated with a pair of flexible elongated member segments 104, if there are multiple such flexible panels, the loading of one might effectively unload an adjacent one. This effect is reduced by the local compressive load transfer afforded by the described compression members 128.

Embodiments Including Serpentine Elongated Members

Figure 10:
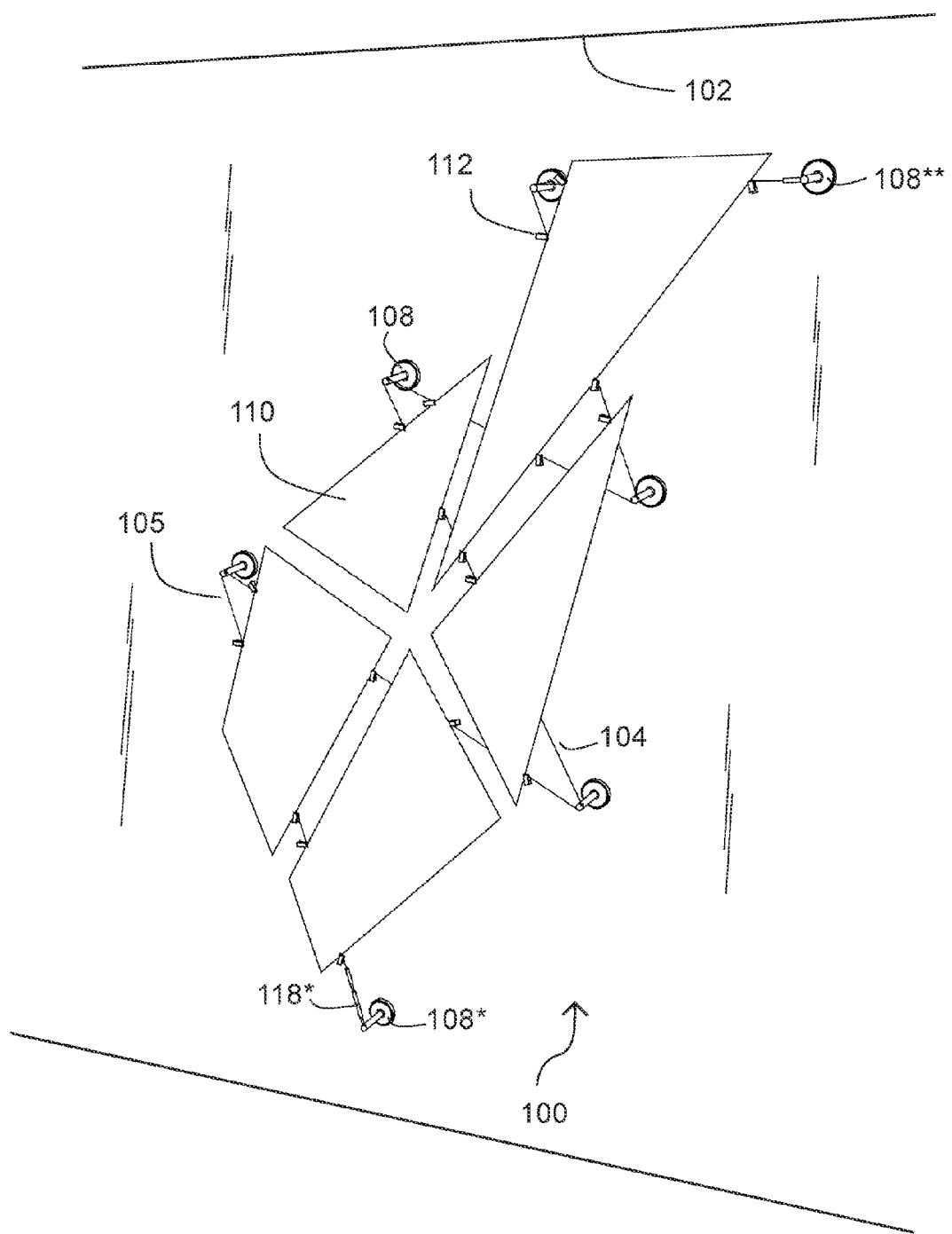
FIG. 10 is a front perspective view of an embodiment of a segmented display array where a single elongated member is used to establish multiple elongated member segments.
Figure 11:
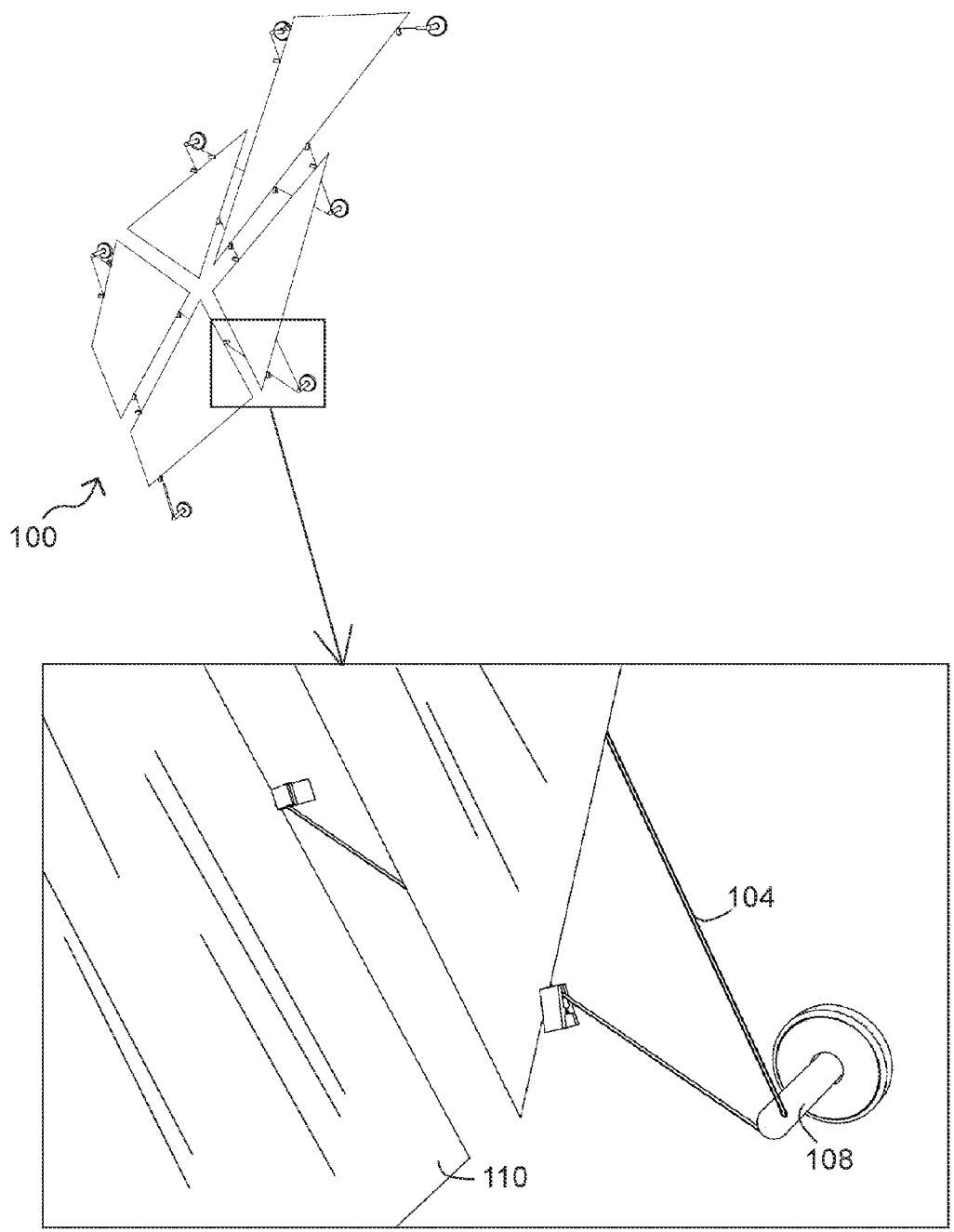
FIG. 11 is a front perspective close up view of a portion of FIG. 10 showing one of the standoff members used.
Figure 12:
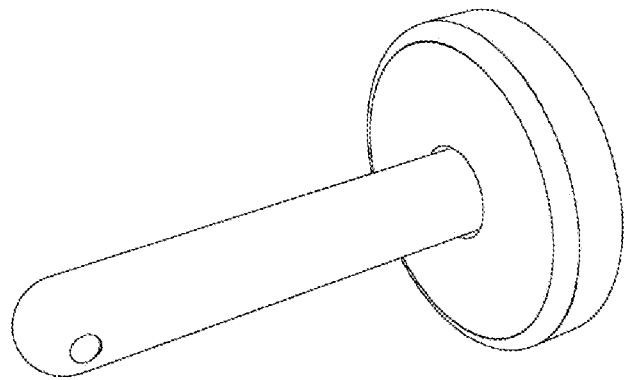
FIG. 12 is an isolated view of the standoff member shown in FIG. 11.

Another embodiment of the segmented display array 100 is shown in FIG. 10. Here a plurality of elongated member segments 104 are established by a single elongated member 105 being routed in a serpentine fashion from an originating length adjustment member 118* (connected to originating standoff member 108*) to a standoff member at the terminating end 108, thereby establishing the shown irregular segmented display array 100 embodiment. The non-originating/non-terminating standoff members 108 in this embodiment (five total) are shown in closer detail in FIG. 11 and can be seen to allow the elongated member 105 to simply pass through. This part is shown in isolated perspective view in FIG. 12**.

Figure 13:
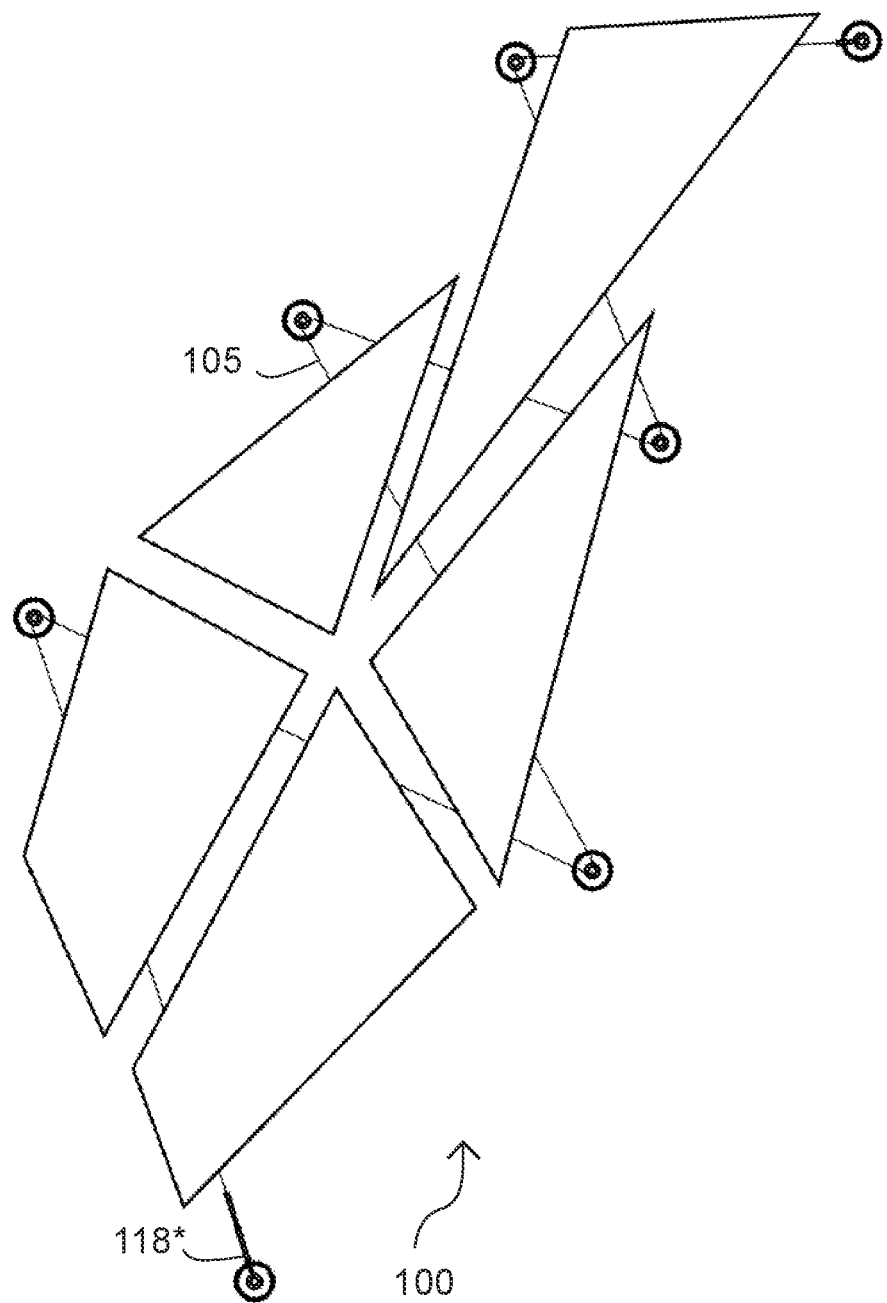
FIG. 13 is a direct front view of the segmented display array of FIG. 10.
Figure 14:
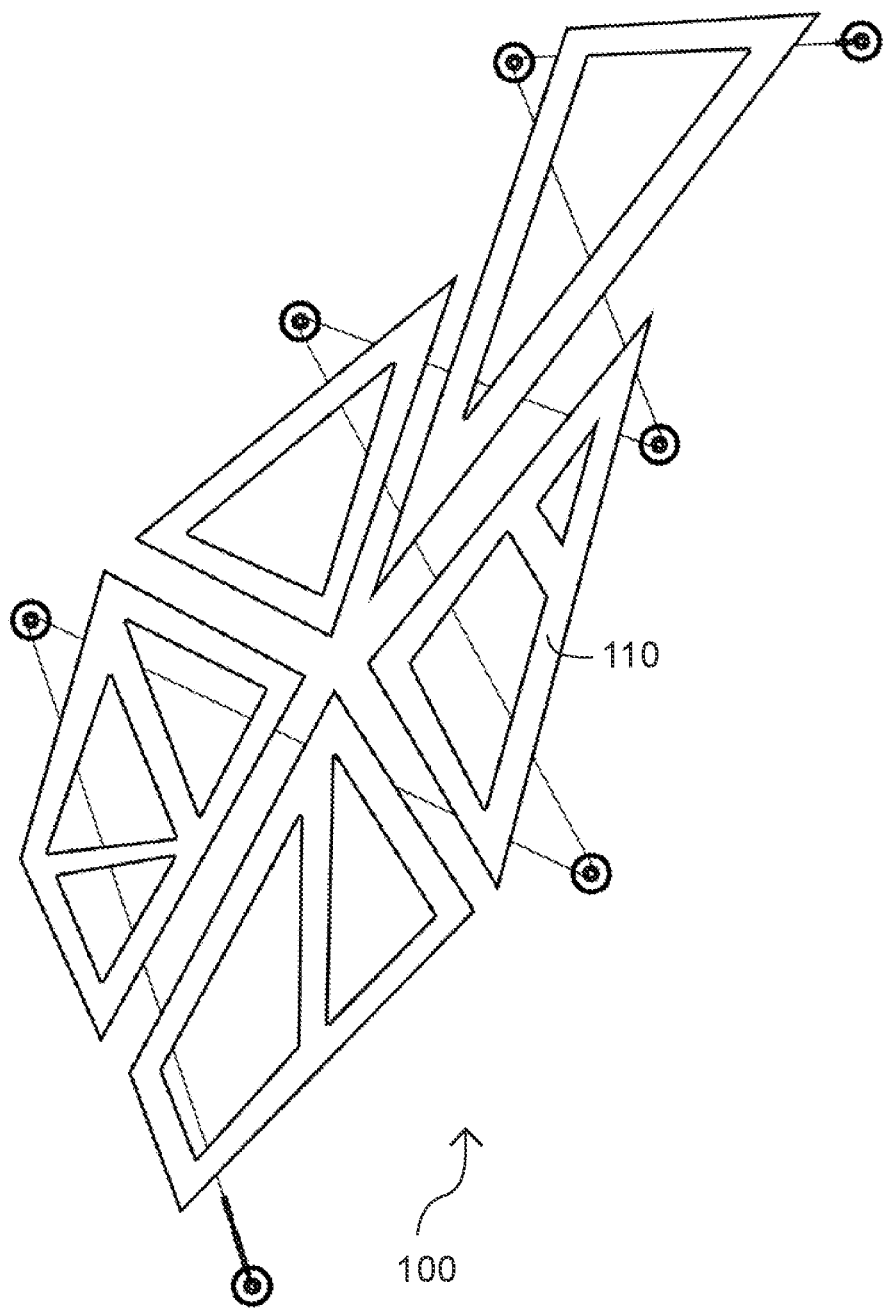
FIG. 14 is a front view of the segmented display array shown in FIG. 13, but with an alternate display panel used.

FIG. 13 shows a front view of the present segmented display array 100 embodiment where, for clarity, no clamps 112 are included. The length adjustment member 118* is manipulated to create tension in the whole elongated member 105. A variation of this embodiment is shown in FIG. 14 where the triangular and trapezoidal display panels 110 of the previous figures are shown with the same shape but with cut outs, illustrating another type of display panel 110 visual effect that can be achieved with this and other embodiments of the segmented display array 100.

Figure 15:
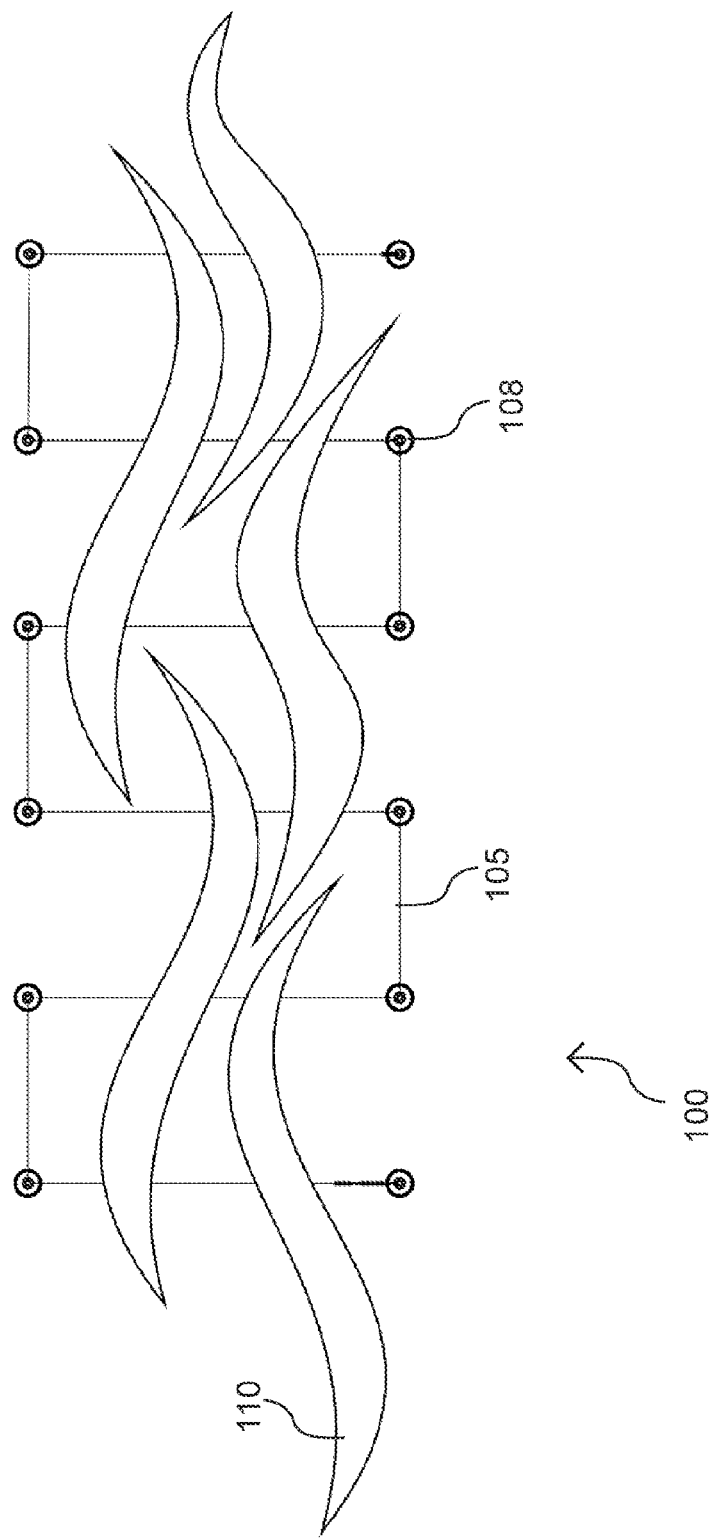
FIGS. 15-17 show front views of alternate single elongated member routing schemes used to achieve various visual and functional effects.
Figure 16:
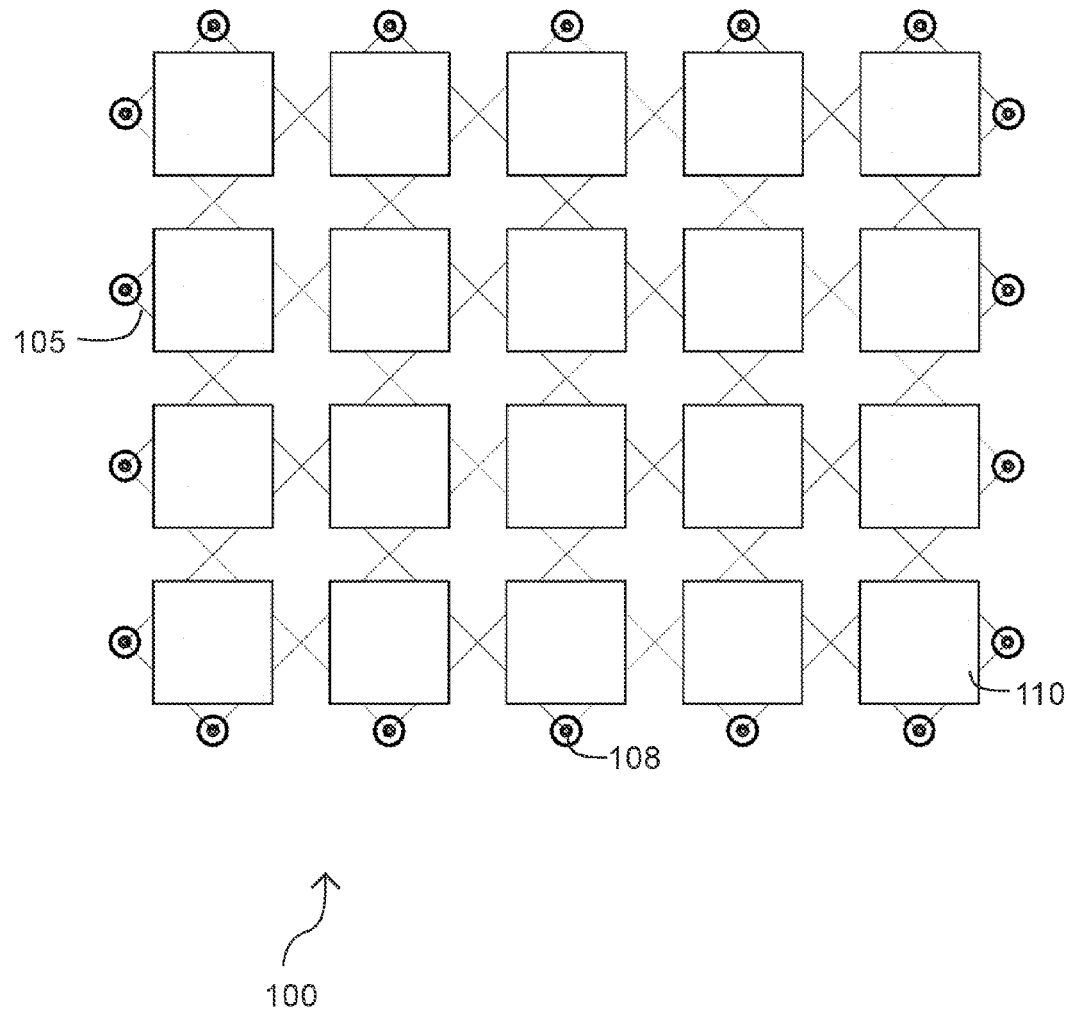
Figure 17:
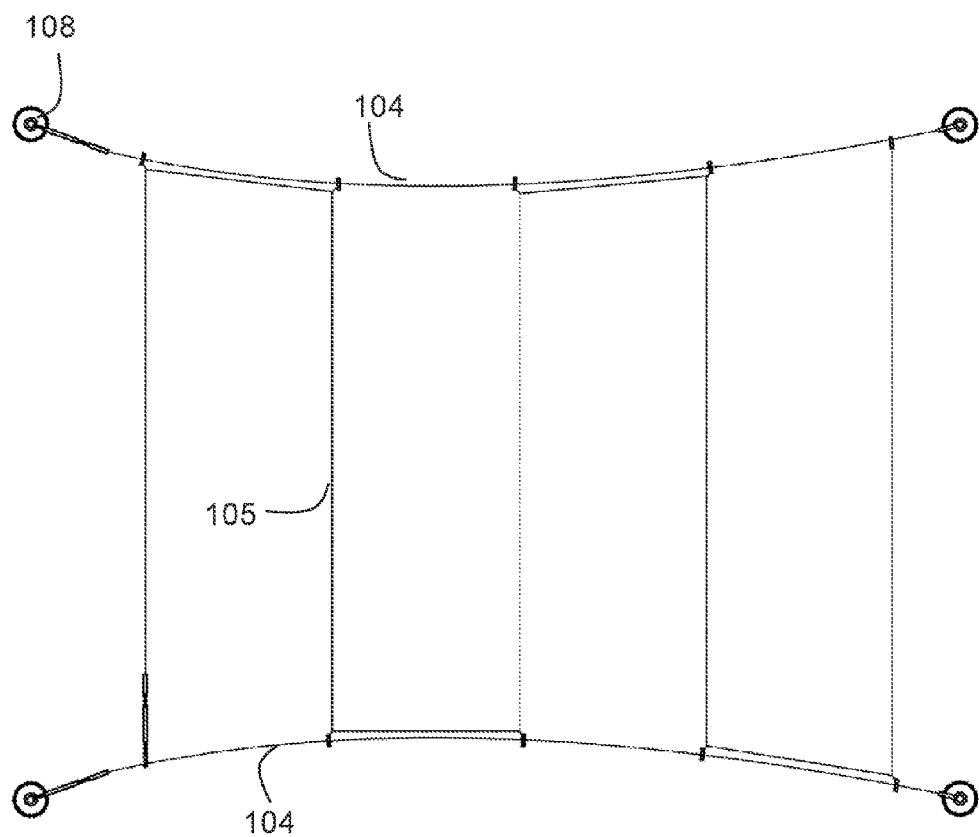

By way of continued illustration, FIG. 15 presents the use of a single elongated member 105 that is routed along multiple standoff members 108 to allow the mounting of the shown wave-like display panels 110. Here again clamps 112 are not shown for clarity, yet they would preferably be positioned analogous to those shown on FIG. 10. FIG. 16 shows a further exemplary segmented display array 100 where the single elongated member 105 is woven between multiple standoff members 108 in a self-intersecting fashion allowing mounting of the shown display panels 110. Finally, FIG. 17 illustrates the serpentine routing of a single elongated member 105 where this routing takes place between two elongated member segments 104. These elongated member segments 104 are held in tension between the standoff members 108 shown. Such an embodiment allows for relatively few standoff members yet establishes an appreciable area for display panel 110 mounting.

Display Panels

It is noted that, in the illustrative embodiments presented thus far, the display panels 110 are typically shown in the figures as blank, generally two-dimensional parts. They are, however, understood to represent a great many possibilities. By way of non-limiting example, the display panels 110 can be: prints on paper, mounted prints, graphics, signage, ads, fabric, translucent plastic, relief cut material, lit material, painted images, acoustic material, metal, wood, glass, acrylic, stretched canvas pictures, artwork of all types, shadow boxes, whiteboards, flat screen displays, video panels, and three-dimensional art. The display panels 110 can further be overlapping and amorphous in form. They need not be stiff but can be textile-based; fabric can be woven about multiple elongated member segments, for example. Any combination of these exemplary elements can be used simultaneously; for example, during the holiday season, ribbons can be interlaced with the elongated members, holly suspended from certain areas, and strings of lights routed to illuminate the installation.

Embodiment Including Magnetic Clamps

Figure 18:
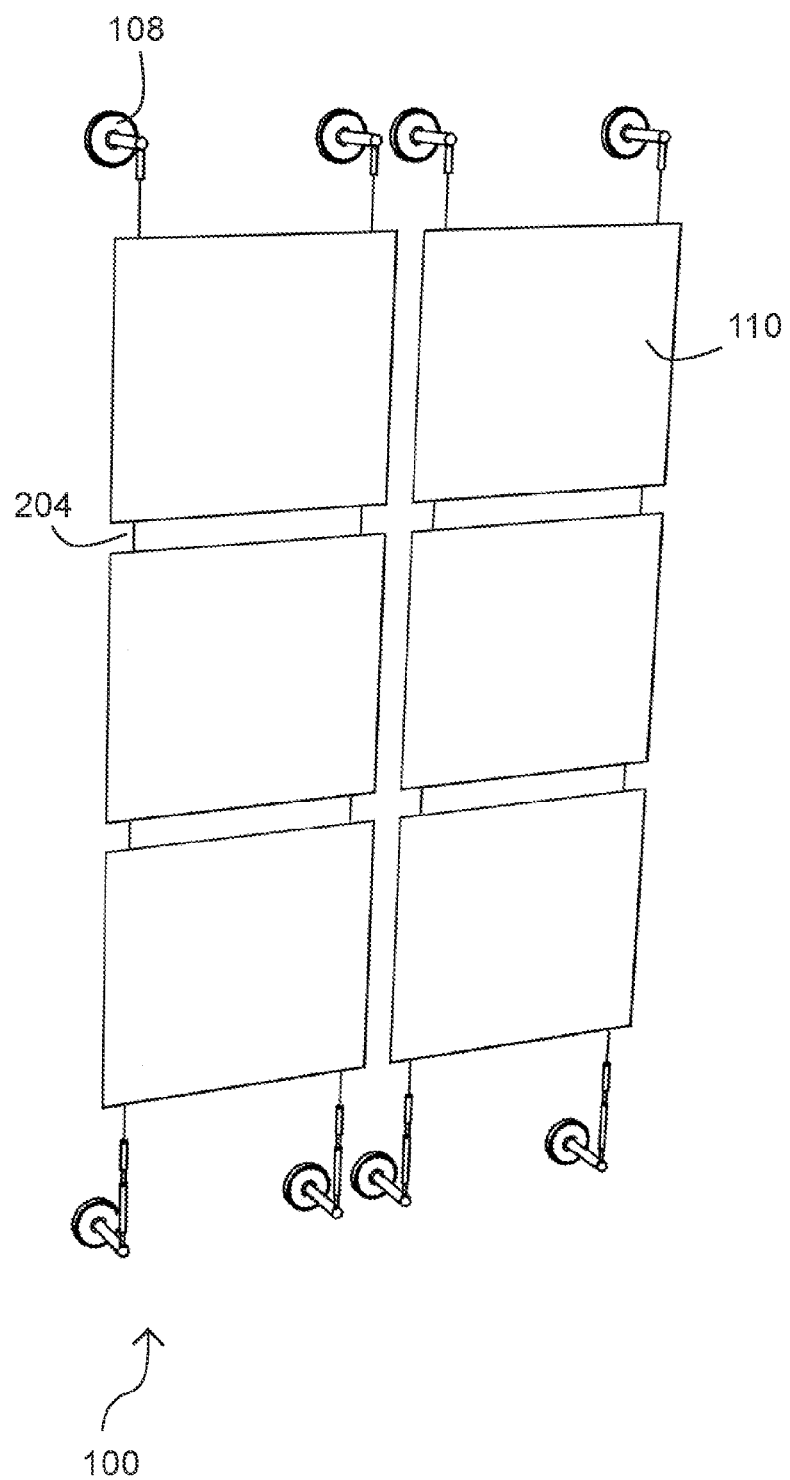
FIG. 18 is a front perspective view of an embodiment of a segmented display array in which permanent magnets are used to achieve releasable display panel coupling.
Figure 19:
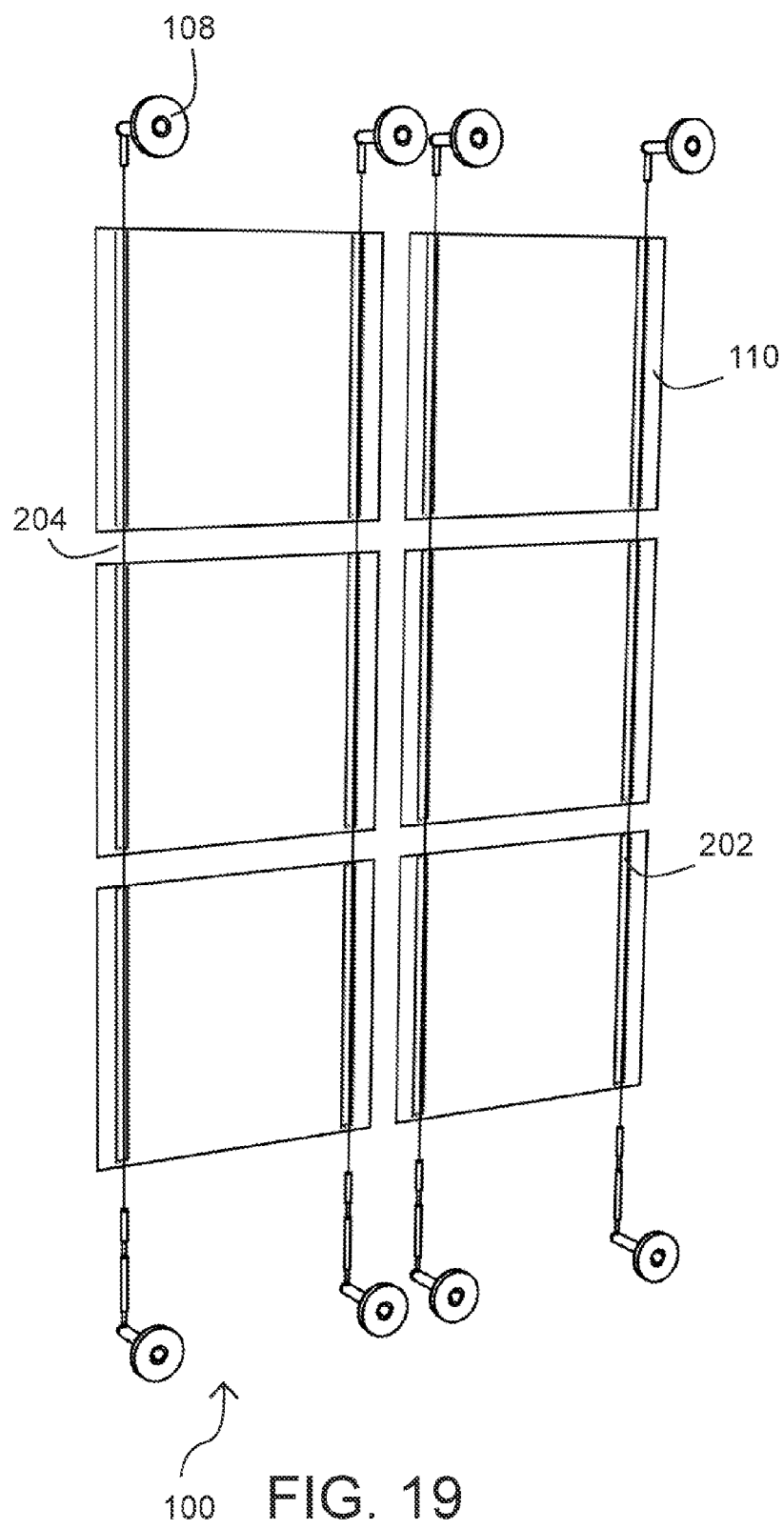
FIG. 19 is a back perspective view of the segmented display array shown in FIG. 18.
Figure 20:
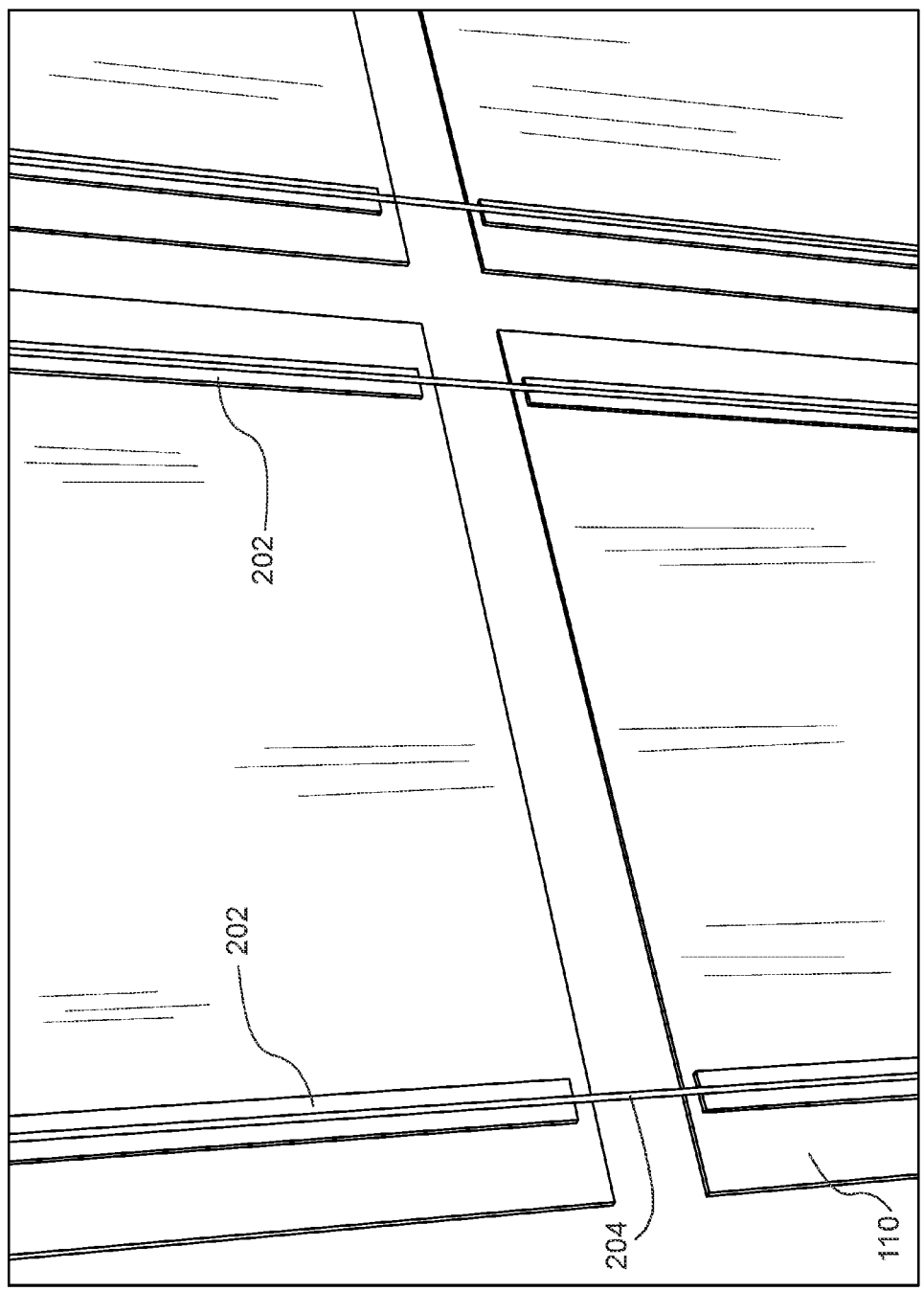
FIG. 20 is a back perspective close up view of a portion of FIG. 19.

In accordance with another embodiment, a segmented display array 100 is presented in FIG. 18 in which display panels 110 have permanent magnets 202 affixed to them which in turn are releasably coupled to elongated member segments containing ferromagnetic material 204. The permanent magnets 202 are only visible from the back, as seen in FIG. 19, and, in closer view, in FIG. 20. In this illustrative embodiment the permanent magnets 202 are sections of commercially available magnetic tape or strip which is cut to length from a roll. One side of this magnetic strip has a removable backing, below which is an adhesive that allows coupling between the permanent magnet 202 and display panel 110. Other magnetic arrangements known to those skilled in the art would also work. In the present embodiment, cable constructed of steel wire is selected as the elongated member segments containing ferromagnetic material 204. The present embodiment is noted to be very simple, reliable, inexpensive, and to have no mounting hardware visible from the front. It is also clear that changing out the display panels 110 is extremely easy.

For a given elongated member segment containing ferromagnetic material 204 and a permanent magnet 202 of a certain length, a fixed attractive force will prevail. A simple and effective way to increase the strength of this connection is to route two elongated member segments containing ferromagnetic material 204 side by side. When the permanent magnet 202 is attached to the pair, the increased contact area will enhance the strength and stability of the connection.

The use of permanent magnets 202 to releasably couple display panels 110 to elongated members 104 can take on additional forms. For example, referring to FIG. 20 for visualization purposes, if the display panels 110 were actually thin steel plates (for example, if steel was being used as an art mounting or if polished steel were serving as the display panel itself), permanent magnets 202 could be used to clamp the elongated member segments 104 to the display panels 110. In the event that the display panels 110 did not inherently contain ferromagnetic material, thin steel strips could be adhered to the display panels 110 and the previous idea used.

As a final note, for purposes of this disclosure and the appended claims, magnetic attachment is included when reference is made to clamping or clamps.

Embodiment Including Panel-Bonded Clamps

Figure 21:
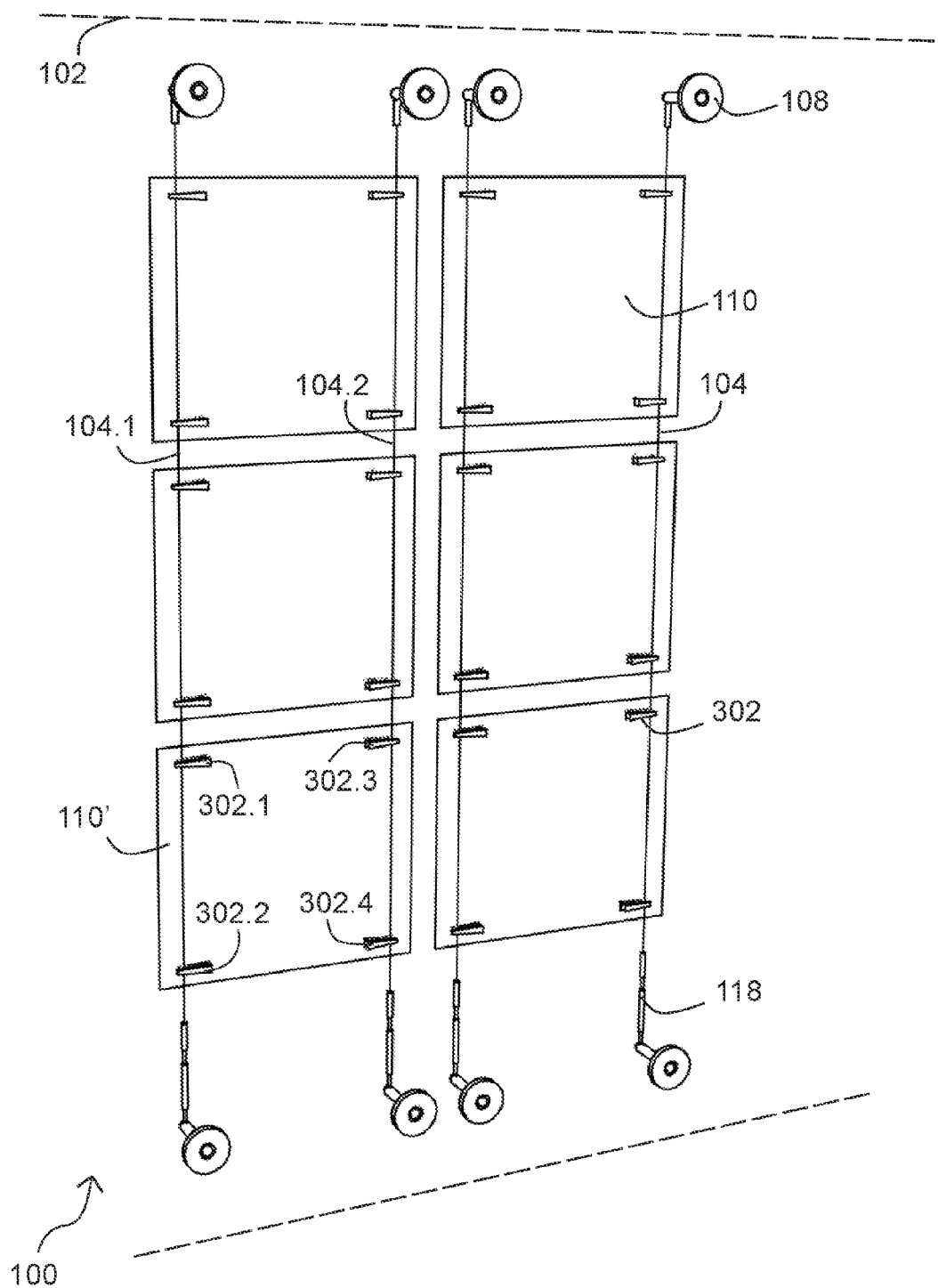
FIG. 21 is a back perspective view of an embodiment of a segmented display array in which bonded clamps secure display panels to elongated member segments.
Figure 22:
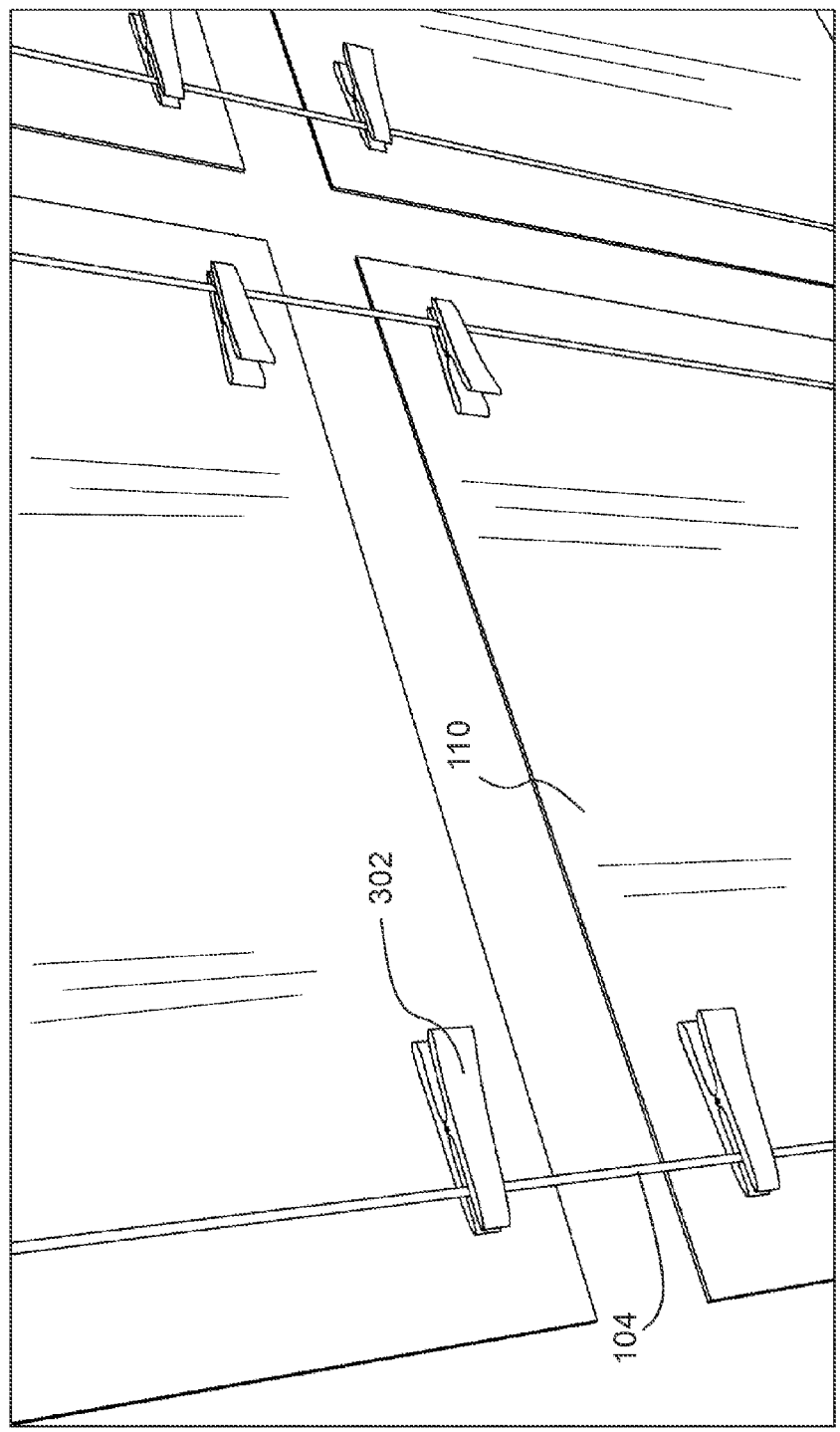
FIG. 22 is a back perspective close up view of a portion of FIG. 21.
Figure 23:
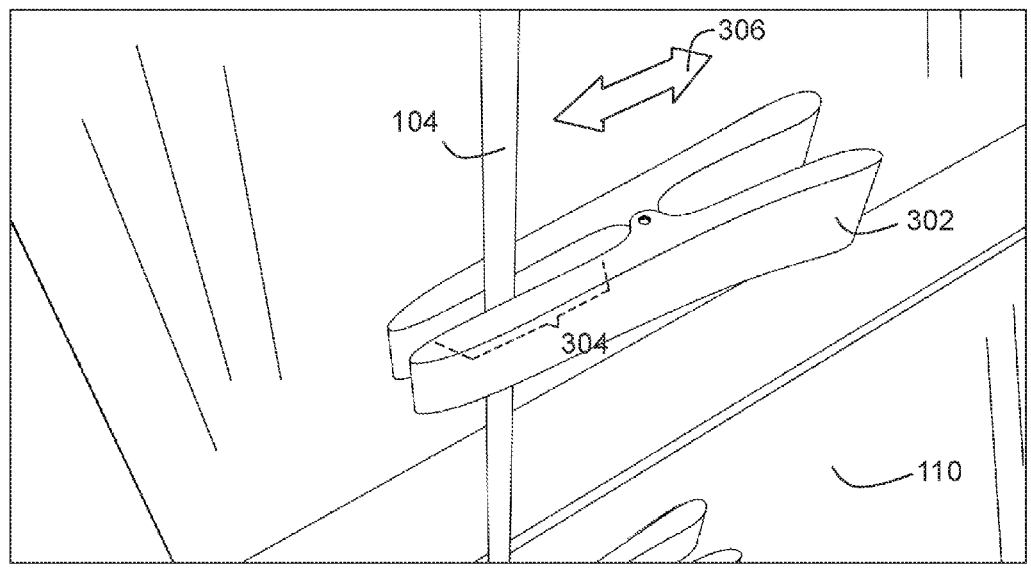
FIG. 23 is a back perspective close up view of a portion of FIG. 22.

In accordance with another embodiment of the segmented display array 100, FIG. 21 shows a back perspective view. The front side of this embodiment is the same in appearance as that shown in FIG. 18 since no clamping means can be seen from the front, yet, as shown in FIG. 21, an alternate attachment means is used. Here each finger-releasable clamp 302 is securely bonded to display panel 110 and then releasably clamped to its associated elongated member segment 104 as shown in greater detail in FIG. 22. Many different clamps known in the art can be selected for the bonded clamp 302; a preferred bonded clamp 302, akin to an alligator clip, is shown in FIGS. 21-23. It has the following desirable characteristics: there are two elastically coupled halves with the bottom half having a planar region favorable for secure bonding to display panel 110; a finger-accessible region that facilitates ready opening of the bonded clamp 302 by hand; a generally planar clamping area 304 that is extended along the longitudinal axis of the bonded clamp 302 that serves as a stable grip region, anywhere along which an elongated member segment 104 can be securely gripped. The planar clamping area 304 affords side-to-side adjustability of the display panel 110 (i.e. the display panel 110 can be positionally adjusted transverse to elongated member segment) as indicated by the arrow 306 in FIG. 23. This adjustability makes for more robust system installation success, allowing for standoff member 108 installation inaccuracies that result in elongated member segments 104 being in slightly off-nominal positions. For simplicity the generally planar clamping area 304 in FIGS. 22 and 23 is depicted as smooth, but there are preferably small opposing teeth or otherwise more aggressive mating surfaces to ensure secure elongated member segment 104 gripping.

Referring again to FIG. 21, we consider the installation steps of this exemplary segmented display array 100. First, the standoff members 108 are attached to the building surface 102 (which is indicated by dashed lines since this view looks through this surface) followed by elongated member segment 104 attachment and tensioning via length adjustment members 118. A given display panel 110', with bonded clamps 302.1-302.4 already attached, is installed as follows: the installer (who, it is appreciated, is on the opposite, non-visible side of the display panels 110 in FIG. 21), has a hand on the top and bottom of display panel 110' and opens bonded clamps 302.1 and 302.2. The installer then angles display panel 110' into the building surface, leading with the edge associated with the open bonded clamps 302.1 and 302.2. Once these clamps are adjacent to elongated member segment 104.1, they are allowed to close around this member and bonded clamps 302.3 and 302.4 are then opened. The display panel 110' is rotated about elongated member segment 104.1 to bring the open clamps into the vicinity of their corresponding elongated member segment 104.2 and then they are allowed to close, gripping this member. In some configurations, the active side of the bonded clamp 302 (i.e. that side not attached to display panel 110) will not clear the elongated member segment as described here. With such geometry, a flexible elongated member segment 104 is used, so that it can be laterally displaced to facilitate clamp clearance and then it is released to spring into the clamping area 304 of the bonded clamps 302.

Embodiment Including Reversible Panels

Figure 24:
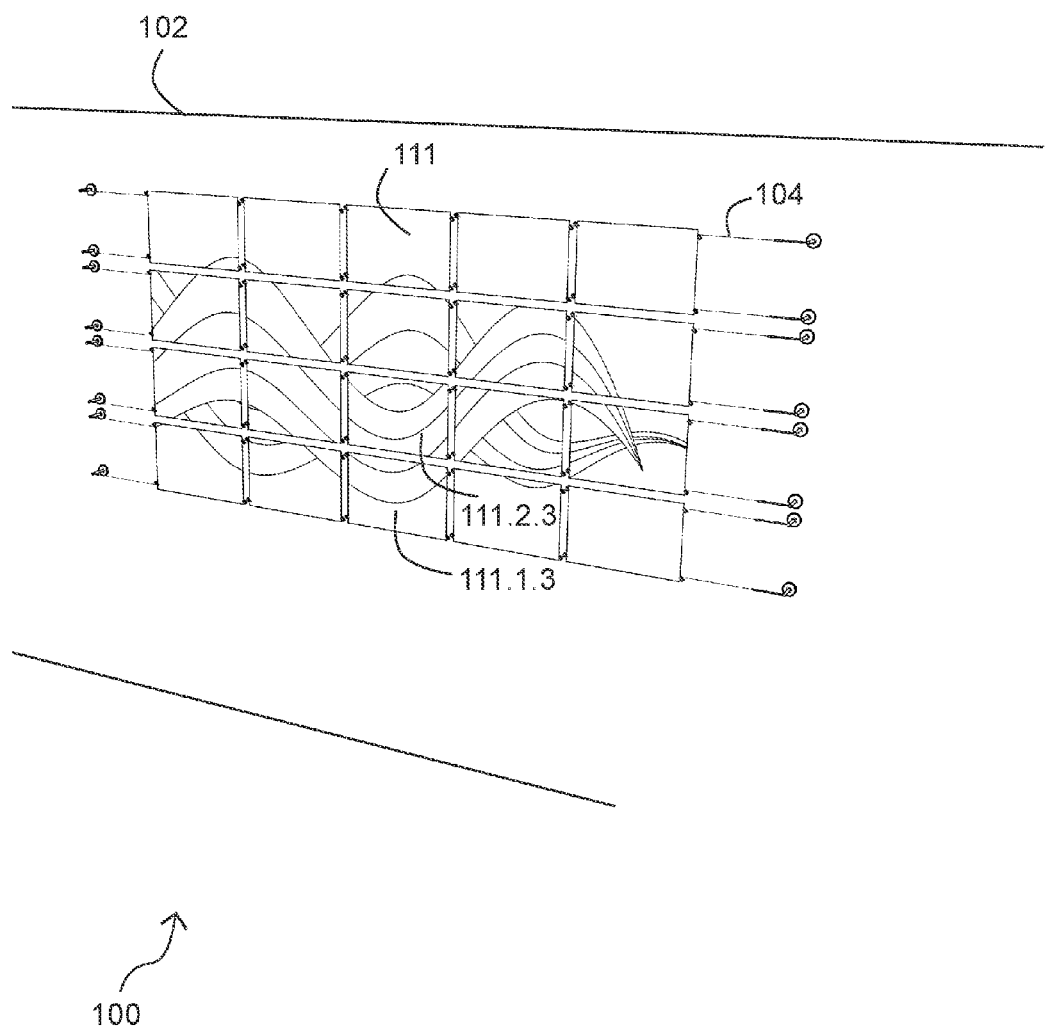
FIG. 24 is a front perspective view of an embodiment of a reversible segmented display array.
Figure 25:
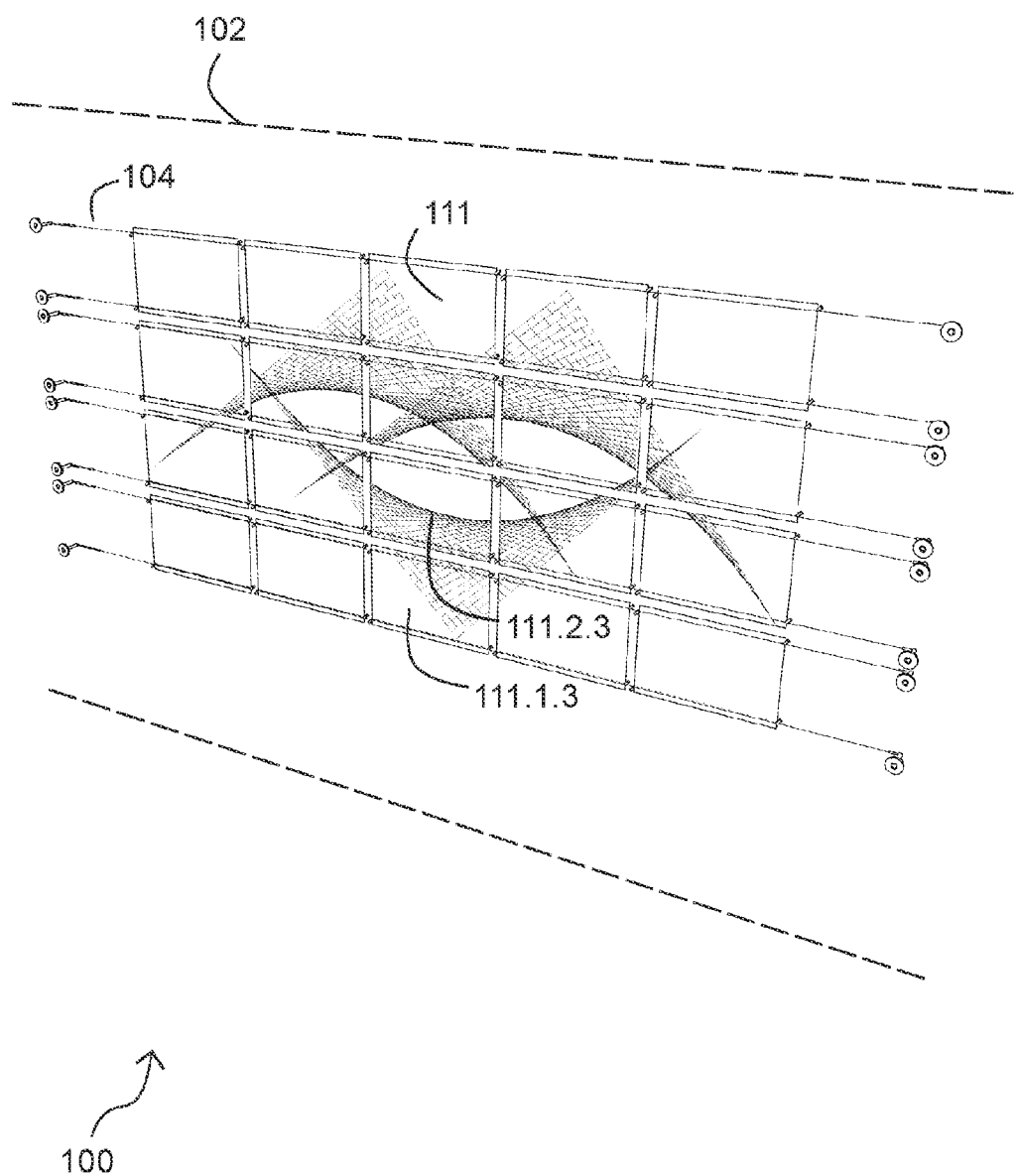
FIG. 25 is a back perspective view of the reversible segmented display array show in FIG. 24.

In accordance with another embodiment of the segmented display array 100, FIG. 24 shows reversible display panels 111 releasably coupled to elongated member segments 104. FIG. 24 is a front view of this segmented display array 100 embodiment, and therefore shows the front faces of the associated reversible display panels 111, whereas FIG. 25 is a back side view of the same embodiment and therefore shows the rear faces of the associated reversible display panels 111. In the latter figure it is noted that the view is looking through the building surface 102. Returning to FIG. 24, it is clear that various reversible display panels 111 have images different than other of the reversible display panels 111, but together they form part of a first larger coherent image 116, which was previously shown in FIG. 2. For example, the pattern of art lines depicted on reversible display panel 111.1.3 is clearly different than that on adjacent reversible display panel 111.2.3, and this pattern is continuous across them. The larger coherent image 116 corresponding to the front side of this segmented display array 100 is therefore visible in segmented form in FIG. 24 and in its full, continuous state in FIG. 2.

Figure 26:
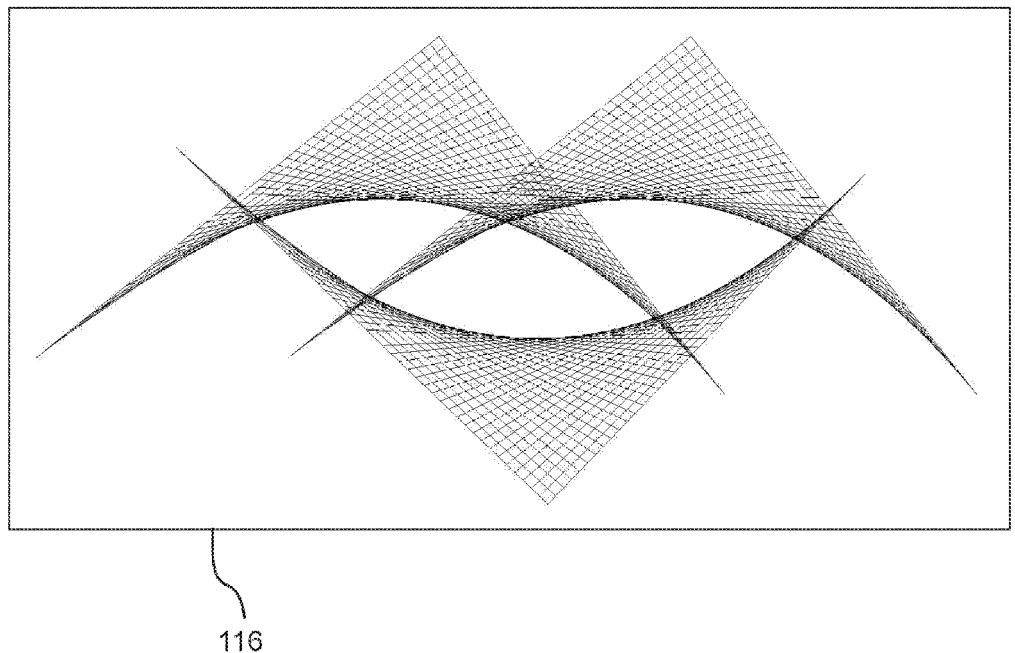
FIG. 26 shows the larger coherent image corresponding to the rear faces of display panels as seen in FIG. 25.

When the back side of the segmented display array 100 is considered, as shown in FIG. 25, the rear faces of the same two reversible display panels 111.1.3 and 111.2.3 are seen to have different images than their front faces (FIG. 24) and to again be different than each other, yet to be part of a second larger coherent image as suggested by the continuity of art pattern across them. This larger coherent image 116 corresponding to the back side of this segmented display array 100 is therefore visible in its segmented form in FIG. 25 and in its full, continuous state in FIG. 26. Hence an embodiment of a segmented display array with reversible panels is illustrated.

Embodiment of Multi-Level Display Array

Figure 27:
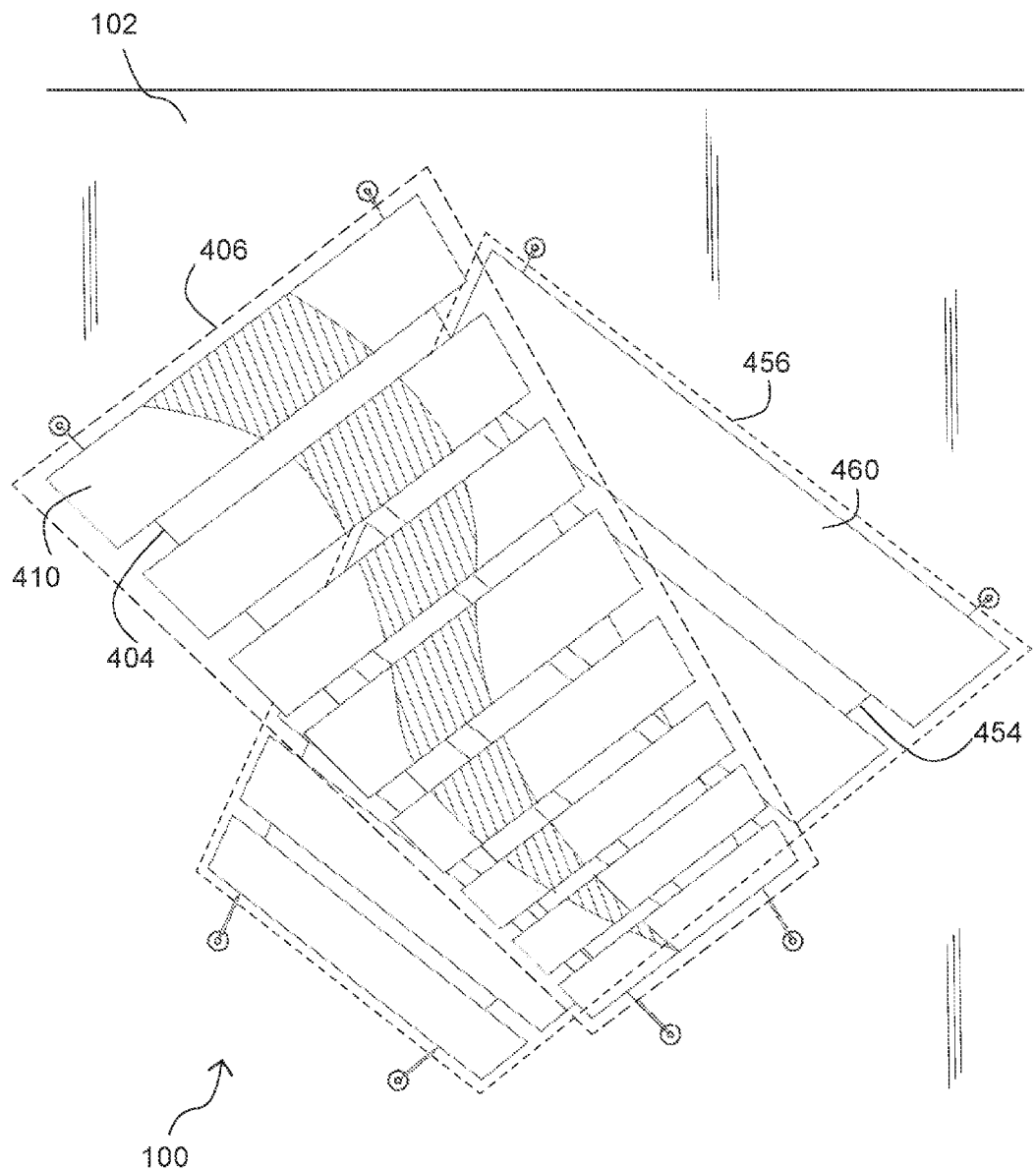
FIG. 27 shows a front view of an embodiment of a two-level segmented display array.

Another embodiment of the segmented display array 100 is presented in front view in FIG. 27. Here the display array 100 is actually composed of two displays, where the first is offset from the building surface 102 a greater distance than the second. For the first display, which can be seen in full, the first suspended elongated member segments 404 are routed to substantially lie within the first plane 406. Now, second suspended elongated member segments 454 are routed to substantially lie within a second plane 456 separate from the first plane 406 and closer to the building surface. There are first display panels 410 releasably attached to first suspended elongated member segments 404, and second display panels 460 releasably attached to the second suspended elongated member segments 454 via releasable attachment means such as the type shown in FIG. 23 (which is not visible in the view presented in FIG. 27). It is noted that the first display panels 410 are correlated such that, though having differing images, they together form a single coherent image. Also, although the both first and second displays present multiple display panels in this embodiment, it is noted that, in the limiting case, the second display could have just one display panel 460. Further, light sources could be coupled to the panel(s) of the second display to enhance the overall visual effect.

Embodiments Including Flexible Standoffs

Figure 28:
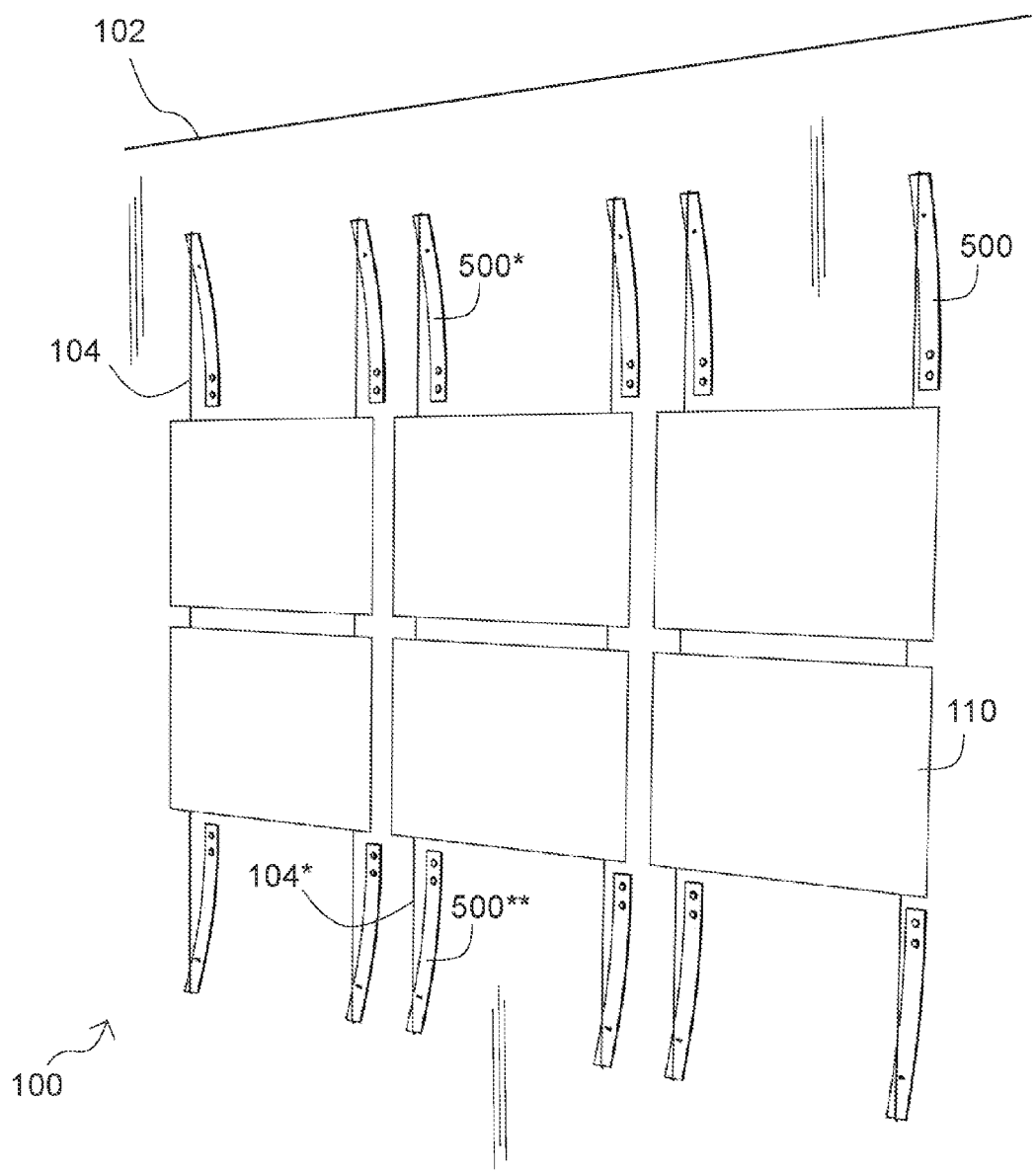
FIG. 28 is a front perspective view of a segmented display array in accordance with an embodiment that uses flexible standoff members.
Figure 29:
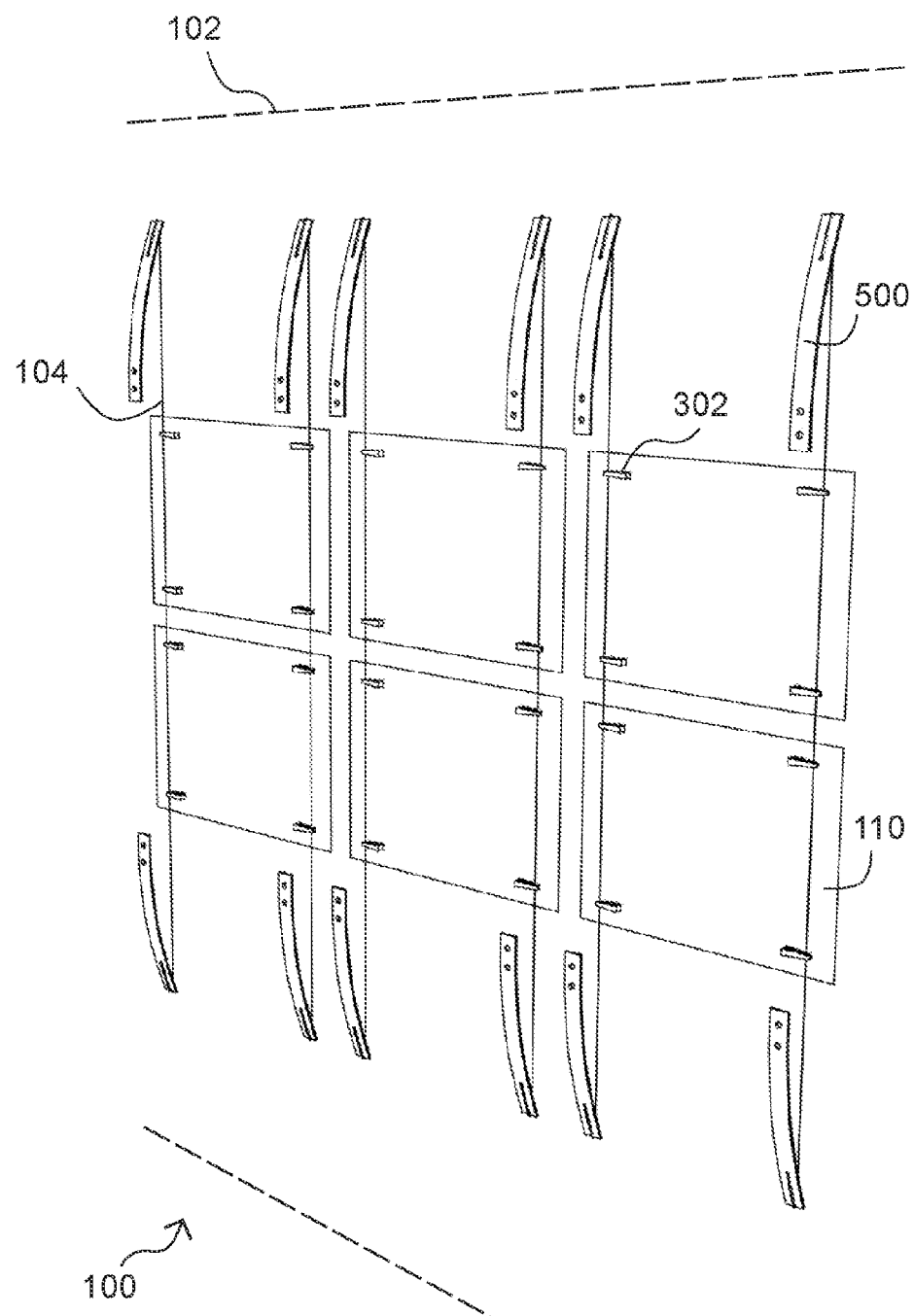
FIG. 29 is a back perspective view of the segmented display array embodiment of FIG. 28.

In accordance with another embodiment of the segmented display array 100, FIG. 28 shows a segmented display array 100 embodiment that uses flexible standoff members 500. Here a front perspective view is presented and FIG. 29 shows a back side perspective view (where building surface 102 is effectively transparent). In this latter view, the attachment means associated with the display panels 110 and elongated member segments 104 is seen to be bonded clips 302. Referring back to FIG. 28, upper and lower flexible standoff members 500 are identical in form and opposite in orientation, each secured at their near ends to the building surface 102 and bending outwards from the building surface 102 at their far ends due to elongated member segment 104 load application. By way of specific illustration, upper flexible standoff member 500\* is coupled to lower flexible standoff member **500\*\* via elongated member segment 104\*. The preferred elongated member segment 104** is cable in the present embodiment, however other flexible members can be chosen such as wire, rope, thread, string, cord and monofilament.

It is clear from the preceding discussion that the flexible standoff members 500 of the current embodiment act as cantilever beams as can be further appreciated from FIGS. 30*a* and 30*b*. FIG. 30*a* shows a flexible standoff member 500 in its deformed (solid lines) and undeformed (dashed lines) states. Thus, prior to load application, this member is a simple straight bar or beam with a hole 520 to accept routing of the associated elongated member segment 104, and two holes in the other end to accept the building surface mounting fasteners 124. There may optionally also be a small notch centered at the top edge at spot 530 on flexible standoff member 500 in FIG. 30*a* to serve as a centering guide or reference for the elongated member segment 104. The flexible standoff member 500 may further have rounded corners (not shown).

Figure 31:
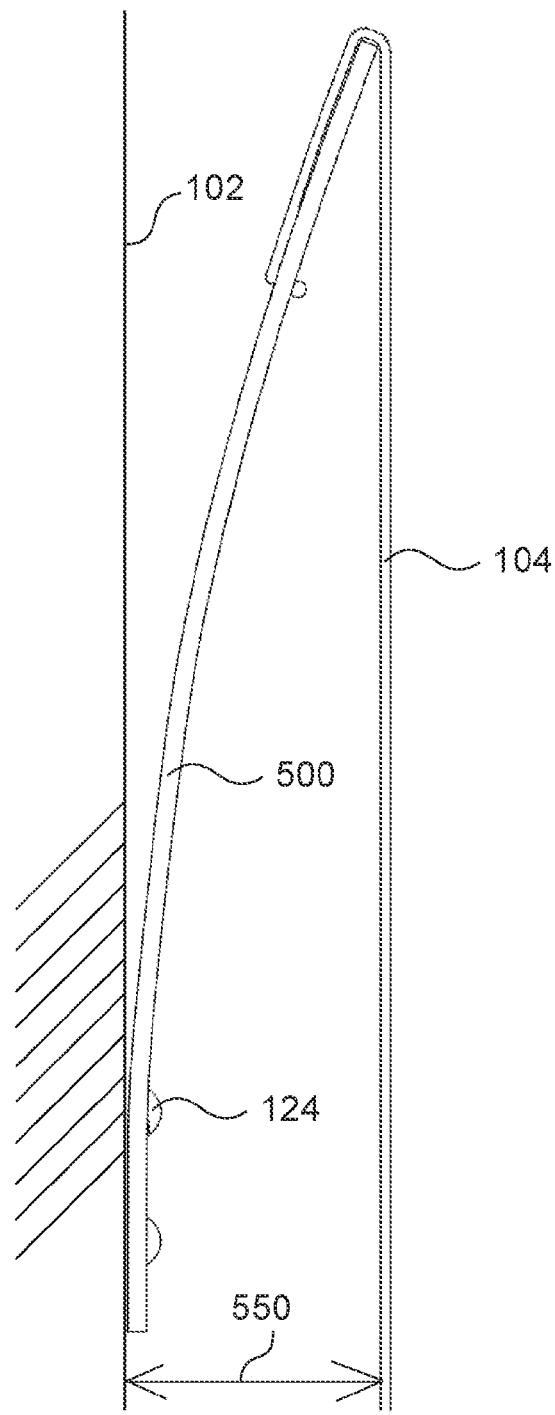
FIG. 31 is a side view of a flexible standoff member used in the top row of the display array embodiment of FIG. 28.
Figure 32:
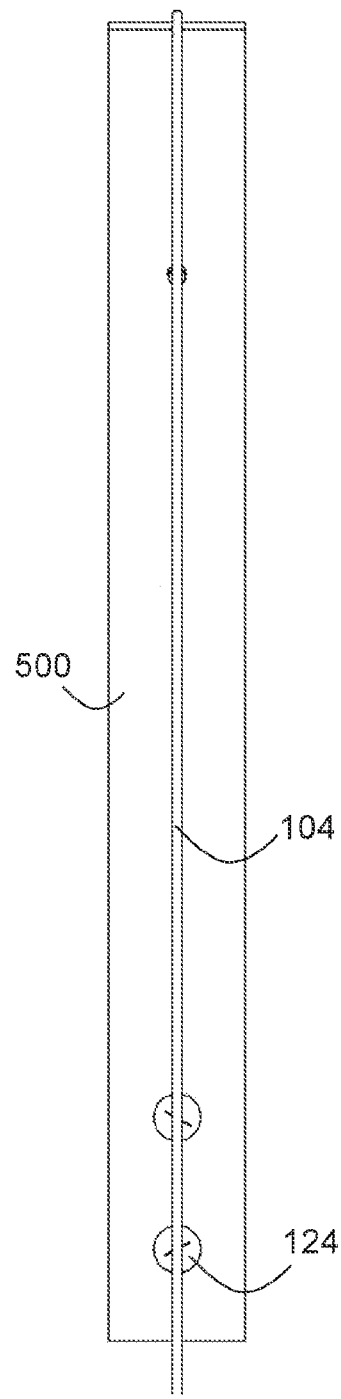
FIG. 32 is a front view of a flexible standoff member used in the top row of the display array embodiment of FIG. 28.
Figure 33:
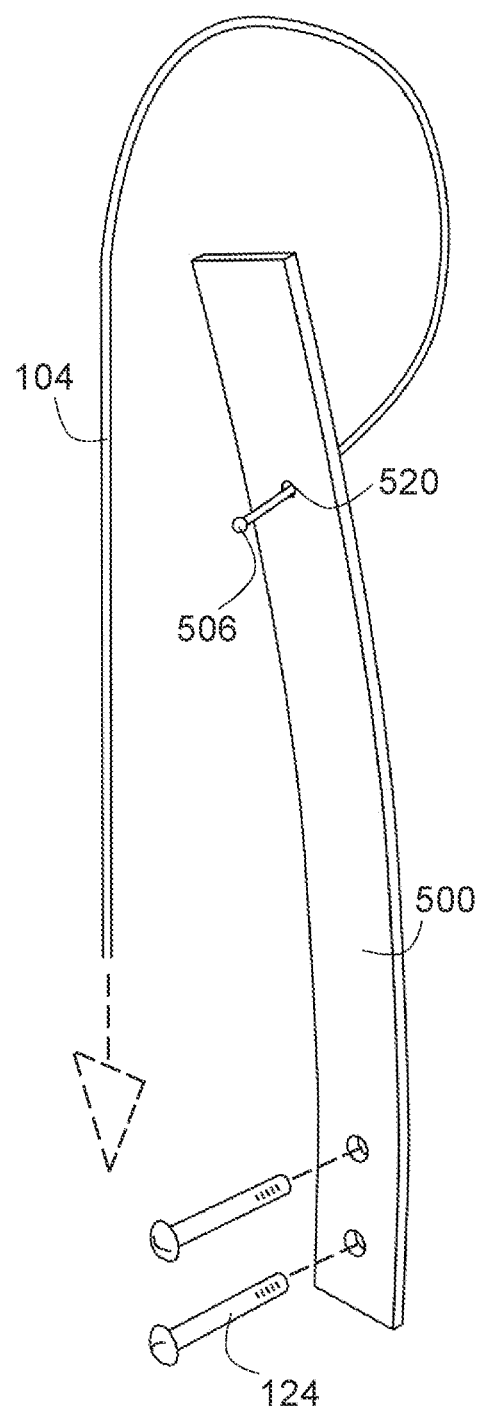
FIG. 33 is an exploded front perspective view of a flexible standoff member used in the top row of the display array embodiment of FIG. 28.

The side view of flexible standoff member 500 in FIG. 31 shows this member in its state of bending and establishes the elongated member segment standoff distance 550. Clearly load application to the elongated member segment 104 results in elastic energy storage in the flexible standoff member 500 and a change (increase) in the standoff distance 550. A front view of the flexible standoff member is shown in FIG. 32 and an exploded view in FIG. 33. The latter view makes the elongated member segment 104 routing clear, where one end of this flexible member is noted to have a fixed terminal 506 that prevents it from slipping through hole 520 in flexible standoff member 500. The other end of the cable goes through the same hole in the opposing flexible standoff member 500 and it is secured in place by a one way removable terminal 507, as shown in FIG. 30*b*.

It has been found that 3/64" stainless steel cable with #80 terminal ball end manufactured by Griplock Systems, LLC of Carpentaria, Calif. works well for the elongated member segment 104 (Part Number: AS-12-80-72). Aluminum, of the type 5052 and thickness of 0.08 inches, has been found an effective material for the flexible standoff members, having a length on the order of 10 inches and a width of 1 inch (these parameters are dependent on the specifics of a given installation). Further, a 1/16" hole 520 has been noted to work well in both flexible standoff members for a given pair, where a one way removable terminal 507 from Griplock Systems with Part Number: DG-12-NT-RR-SAT serves ideally. Certainly the flexible standoff member could be made out of steel, plastic, composites, and a host of other materials. The other specifics of this example could also be substantially altered for a given system, and are therefore disclosed here purely for purposes of illustration. It is parenthetically noted that, for this specific system, neither the removable terminal 507 nor the fixed terminal 506 are actually needed. The size of the hole 520 and the sharp angle through which the cable 104 must go to thread through this hole 520 causes the cable 104 to lock in the hole; the harder the cable is pulled, the more securely the cable 104 seats in place. (This is analogous to being able to easily pass a length of cable through a close-fitting hole by pulling on the cable parallel to the hole's axial direction, but not being able to pull the cable through by pulling perpendicularly to this first direction, but rather causing binding instead.)

Referring to FIGS. 28 and 30, we review the construction sequence for the present embodiment. Flexible standoff members 500\* (upper) and **500\*\* (opposing lower) are first secured to building surface 102 with mounting fasteners 124 in the positions and orientations shown in FIG. 28. Next a small object is placed under the free end of each 500\* and 500\*\* to hold them in a deformed position away from the wall (akin to their final position as shown in the figure). This is done in such a manner that holes 520 are still accessible, allowing the threading through of elongated member segment 104\* first through the hole 520 in upper flexible standoff member 500\*, looping around 500\* top-most portion (see FIG. 30***a*), and then being routed downward to **500\*\*. At 500\*\*, the flexible member 104\* is looped around the lower-most portion of 500\*\* (see FIG. 30***b*) then threaded through hole 520 in **500\*\* and retained by one-way removable terminal 507. Then the elongated member segment 104\* is pulled taut with the flexible standoff members still in their forced deformed state. The blocks are next removed and any final cable adjustment is made to achieve the final desired standoff distance 550. This process is repeated across all flexible standoff members 500** of this embodiment followed by the expected subsequent system installation steps.

Figure 34:
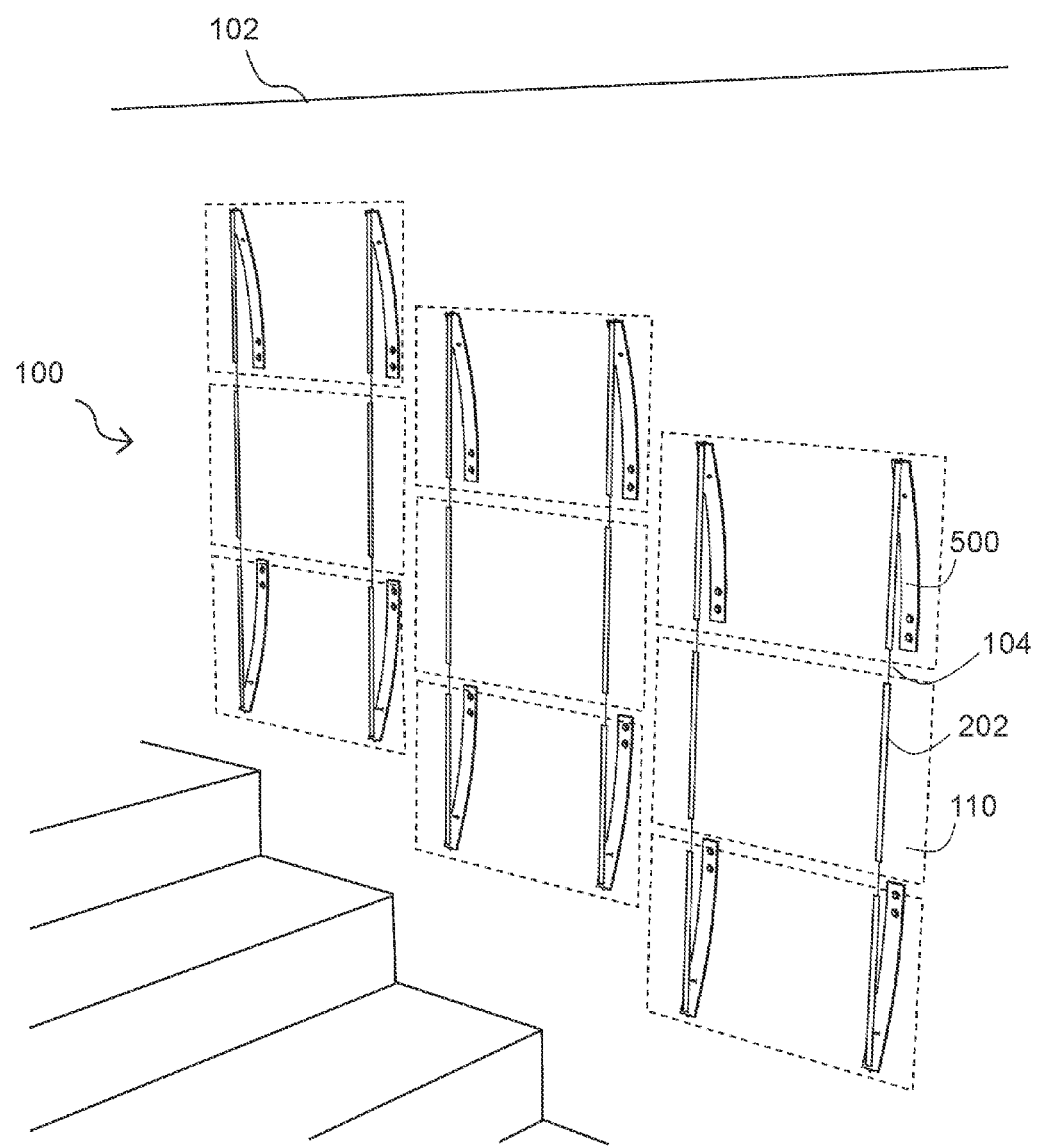
FIG. 34 is a front perspective view of a segmented display array in accordance with another embodiment that uses flexible standoff members and magnetic attachment means for display panels.

It is noted that in FIG. 28, there is enough room for another row of display panels 110 both above and below the display panels 110 presented. Such an addition would make the building surface mounting hardware nearly vanish from many vantage points. This is an inherent advantage of the present embodiment that is illustrated in different form in FIG. 34. Here the display panels 110 are depicted as transparent with dashed lines indicating their edges. They are releasably attached to elongated member segments 104 via permanent magnet strips 202. It is evident that the mounting hardware here is also substantially visually obscured by the display panels 110. Certainly making the flexible standoff members 500 shorter, and placing column pairs closer together would make them even less visible.

Besides offering the advantage of minimally visible display hardware, other strengths of segmented display array embodiments that utilize flexible standoff members 500 include the fact that no length adjustment member 118 (e.g. FIG. 21) are needed. Further, a continuous range of elongated member segment standoff distances 550 can be achieved. The flexible standoff members 500 as exemplified here can easily and inexpensively be cut from sheet material, such as steel or aluminum, and shipping of such flat members is quite convenient. Flexible standoff members according to the present embodiment can further readily accept paint and/or a host of other surface treatments to best agree with their installation environment. Their flexibility can also been seen as a safety advantage in light of the potential case of a person inadvertently and forceably pressing the elongated member segments 104 towards a building surface (due, for example, to a collision). Greater system flexibility will result in reduced reaction loads into the person and wall.

A high degree of flexible standoff member 500 customization is possible for the present embodiment to suit the demands of a wide range of segmented display arrays 100. For example, the material and associated thickness for the flexible standoffs 500 can be selected to achieve the best mechanical and aesthetic results. The cut profile that determines the width of the part, and whether this is constant or varying can further be adjusted, as can the length of the flexible region; both of which will substantially influence its stiffness. Further, multiple flexible standoff members of the present embodiment can be stacked on top of each other prior to being loaded to accommodate a wide range of conditions. These variables allow for the upper flexible standoff member 500 to be stiffer than the lower one, if need be. Slotting the holes to receive building surface mounting fasteners 124 (see FIG. 33) is another approach at building adjustability into the flexible standoff members 500. This is relevant when the display panels 110 associated with the standoffs 500 are of significant weight and vertical suspension of the elongated member segment 104 is desired (the upper standoffs 500 will experience more load and therefore may need to be stiffer that the lower).

While the focus of embodiments presented here have been two opposing flexible standoff members 500, there could clearly be just one flexible standoff 500 opposing a conventional standoff 108, such as that presented in FIG. 5.

Figure 35:
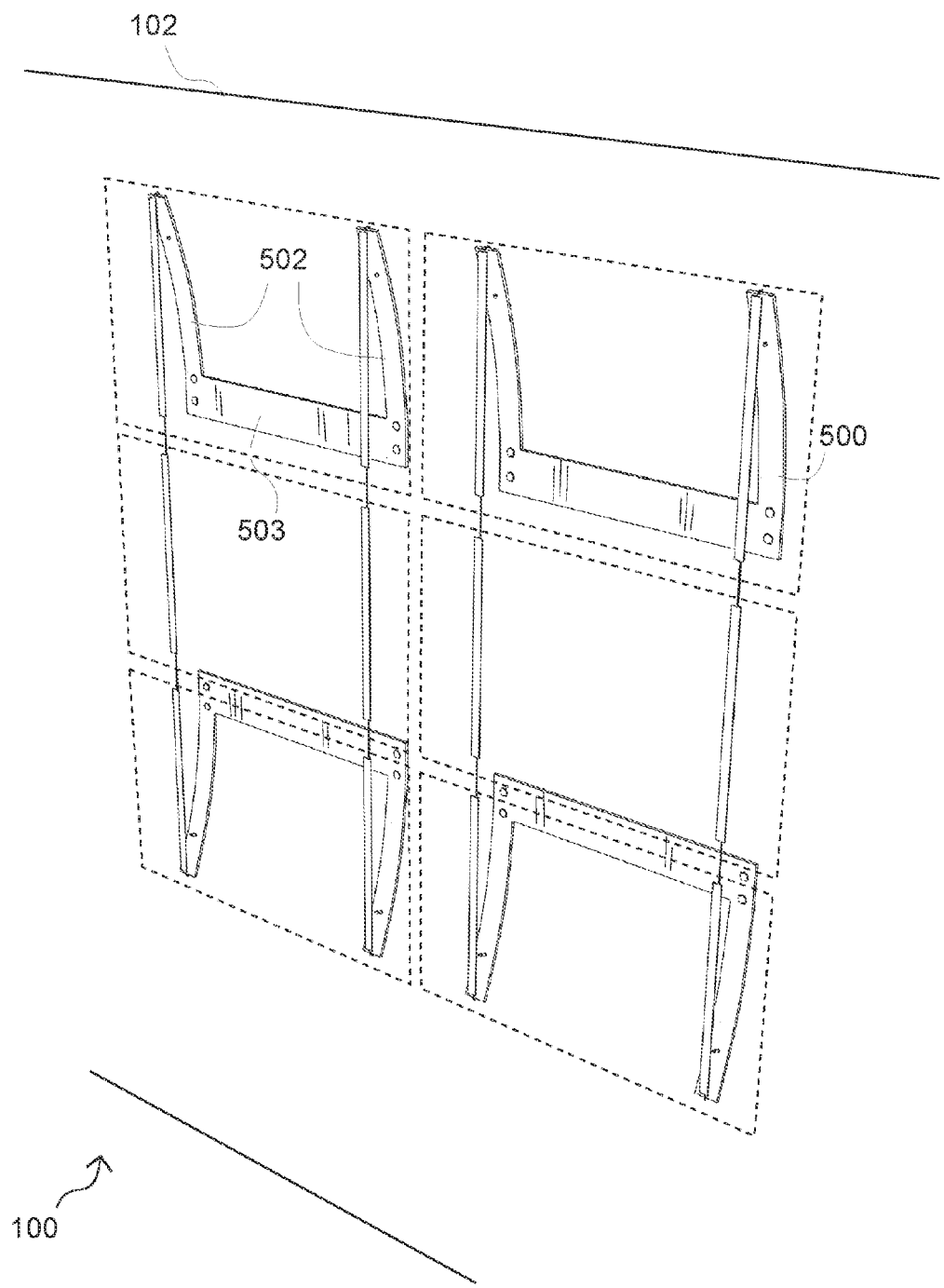
FIG. 35 is a front perspective view of a segmented display array in accordance with another embodiment that uses flexible standoff members and magnetic attachment means for display panels.

Flexible standoff members 500 are typically not wholly flexible. In the embodiment presented in FIG. 30*a*, for example, clearly the small region of this member surrounding the building surface mounting fasteners 124 does not flex. This is seen more substantially in another embodiment shown in FIG. 35 where two adjacent flexible standoff members are integrated into a single part that is still designated a flexible standoff member 500, yet is composed of distinct regions comprising both elastic elements 502 that store elastic energy upon tensioning of associated elongated member segment 104 (thereby changing standoff distance 550), and an inactive element or area 503 that does not deform. The purpose of the inactive portion 503 in the case of the embodiment shown in FIG. 35 is to facilitate wall mounting and to minimize part count and provide for ease and stability of installation.

Figure 36:
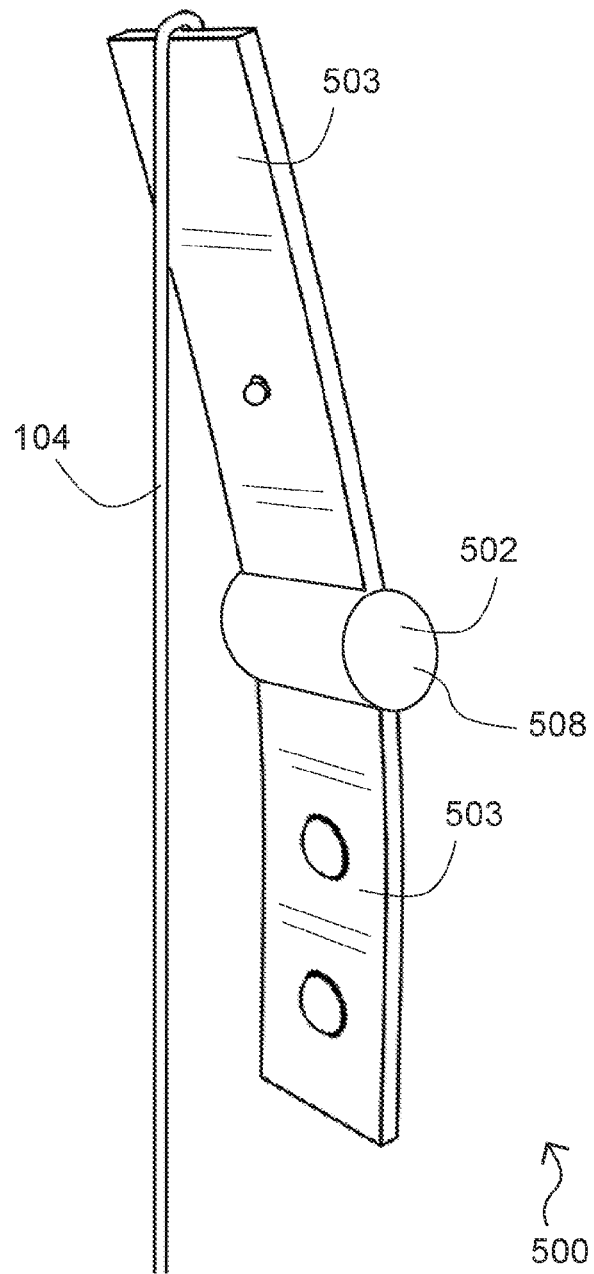
FIG. 36 is a front perspective view of a flexible standoff member embodiment that uses a torsional spring as the elastic element.

Certainly other types of flexible standoff member 500 deformation are contemplated besides the bending illustrated thus far. It may be that this part is configured such that compressive load causes elastic element 502 deformation. Or, for example, an elastic element 502 that stores energy torsionally could be used. This is illustrated in FIG. 36 where a torsional spring 508 is notionally represented and the remaining portions of the flexible standoff member 500 are elastically inactive 503.

Figure 37:
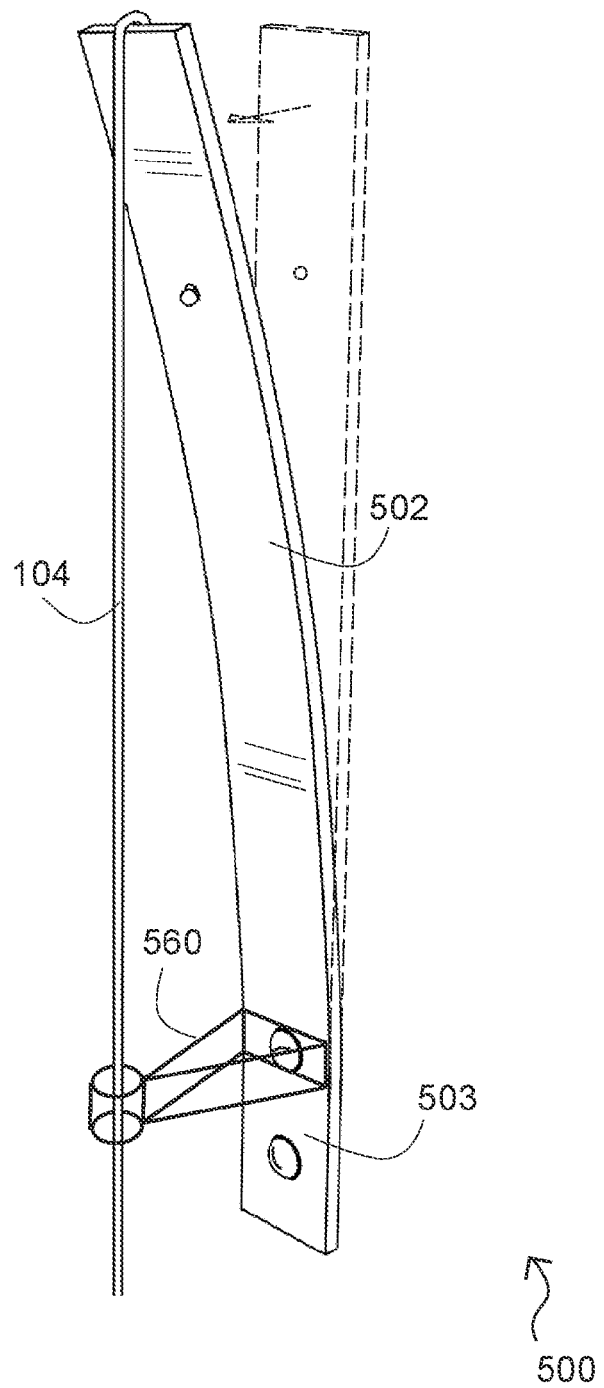
FIG. 37 is a front perspective view of a flexible standoff member embodiment that has both an elastic element and a constant-distance member.

For those instances where continuous standoff distance variation as a function of elongated member segment 104 load is not desired, but rather a fixed distance is needed, FIG. 37 presents one embodiment of a solution. This flexible standoff member 500 uses a constant-distance member 560 to ensure a standoff distance that is independent of the state of deformation of elastic element 502, which in this case is a beam in bending.

Kit and Template Embodiments

Figure 38:
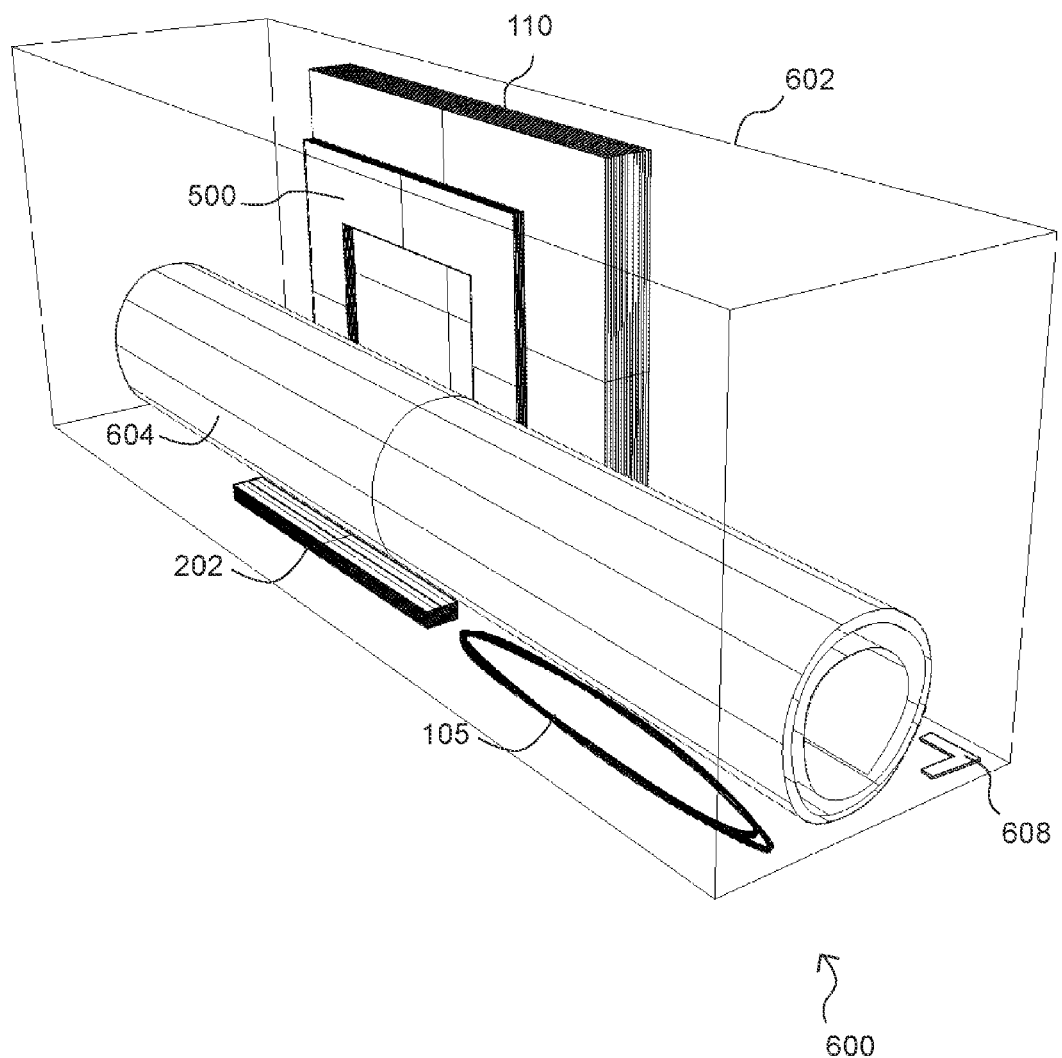
FIG. 38 is a perspective view of an embodiment of a kit for installing a segmented display array.

In an embodiment depicted in FIG. 38, a kit for installing a segmented display array 600 is presented. By way of non-limited example this includes, in container 602, elongated member 105 that is here shown uncut but may also come in segments. Four elongated member segments 104 are to be cut from this item. A sufficient number of standoff members 500, are included for suspending the four elongated member segments 104 from a building surface 102. Also included in this container 602 are 8 display panels 110 and 16 permanent magnets 202 to be bonded to the display panels 110 and secured to elongated member segments 104. Also included in this exemplary kit is a template 604 for assisting standoff member 500 positioning on building surface 102. Finally, a spacer 608 is included for final display panel 110 positioning.

Figure 39A:
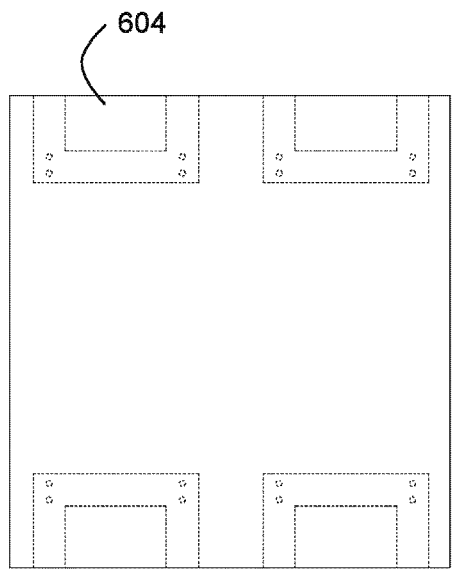
FIG. 39a,b,c are plan views of different template embodiments helpful in installing standoff members.
Figure 39B:
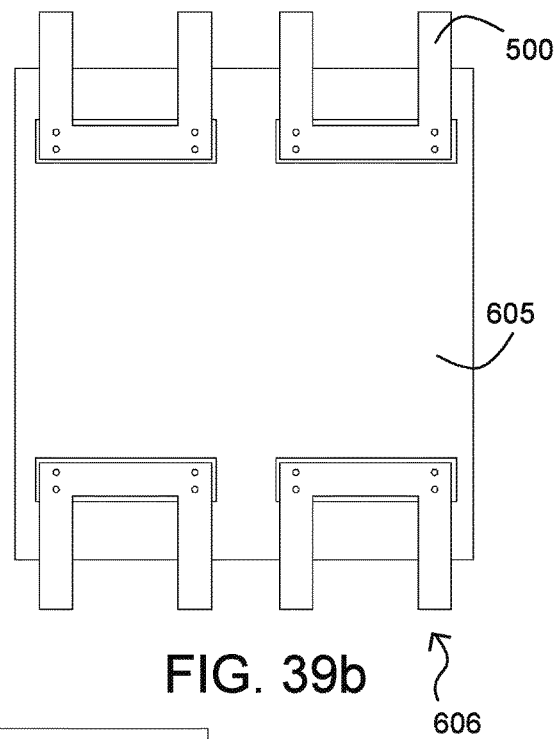
Figure 39C:
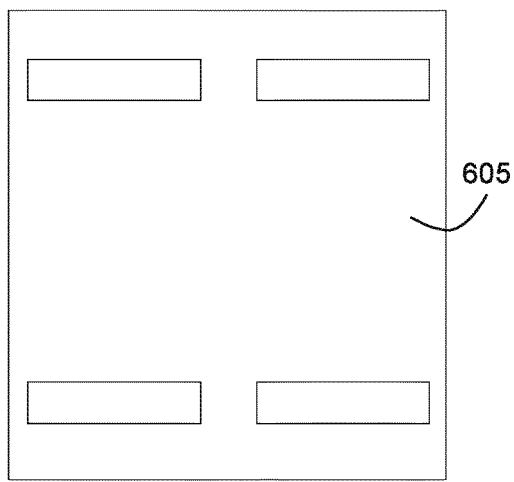

The template 604 is shown unrolled in FIG. 39*a*. The material is preferably paper, but a host of thin materials including plastic would be adequate provided the printed dashed lines adhere to it and it can be easily drilled through to establish mounting holes in the building surface 102. As an alternate, more rapid installation tool, an embodiment of a modified template which has standoff members affixed directly to it 606 is shown in FIG. 39*b*. The modified template 605 has windows cut out of it, as shown in FIG. 39*c*, to allow direct contact between the mounting region of each standoff member 500 and the corresponding area on the building surface 102. A temporary bonding agent secures the standoff 500 and template 605 together, such as from a light duty glue or tape. Using the modified template and standoff assembly 606, the standoffs 500 are positioned on and coupled to the building surface 102 in one step. (Template 604, on the other hand, requires drilling, template removal, and then standoff attachment). The more rapid approach associated with template 605 is made possible by using, by way of non-limiting example, such wallboard fasteners as Wall-Dogs (by Powers Fasteners, Inc of Brewster, N.Y.). These are one piece threaded fasteners that can directly mount hardware to drywall. Therefore, once the template/standoff assembly 606 is in the desired position on the building surface 102, fasteners need simply be inserted into standoff receiving holes, secured to building surface 102, and the modified template 605 can then be torn away. This is followed by the normal installation steps of the segmented display array 100.

Figure 40A:
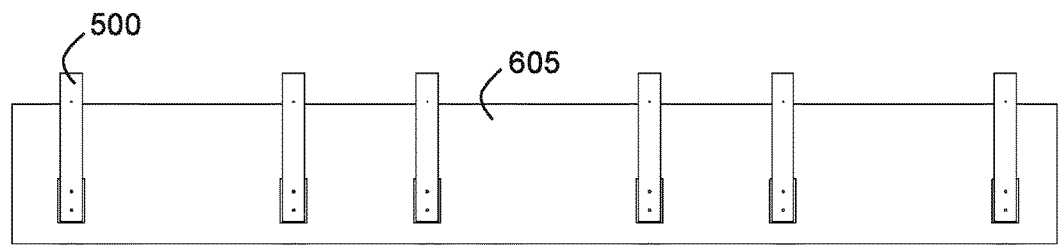
FIG. 40a, b, c are additional plan views of template embodiments helpful in installing standoff members.
Figure 40B:
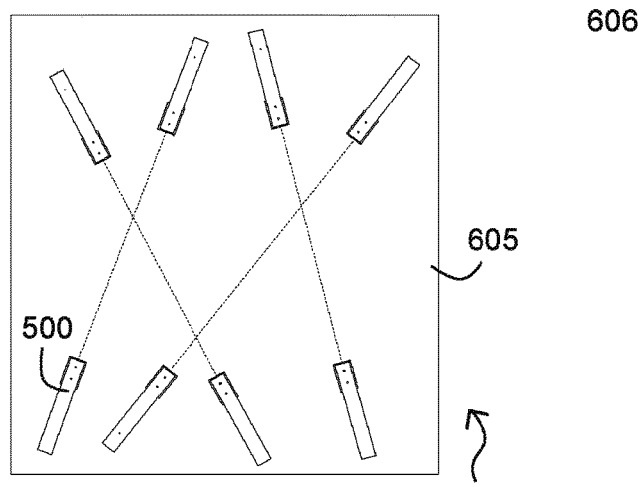
Figure 40C:
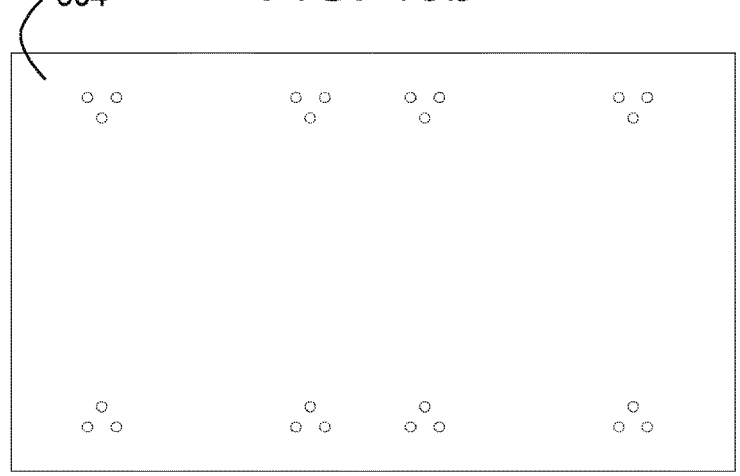
Figure 41:
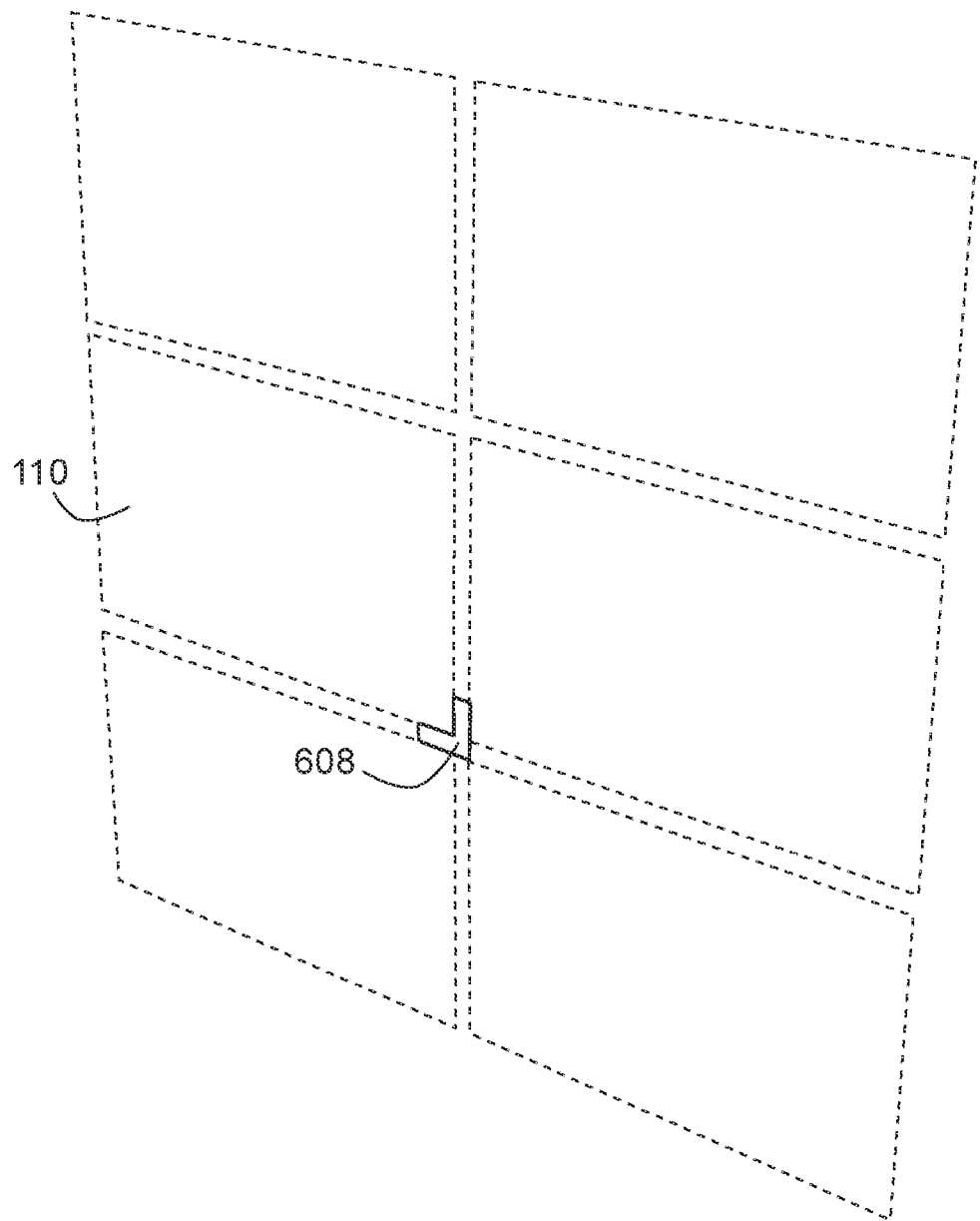
FIG. 41 is a perspective view with exemplary display panels and a spacer embodiment.

By way of further illustration, FIG. 40*a* shows another embodiment of template and standoff assembly 606 that can be used for rapidly installing a different type of standoff member 500. The small cut out windows in the template 605 near the bottom region of the standoffs 500 can be noted. FIG. 40*b* depicts yet another template/standoff assembly 606 embodiment. This is for creating a less regular elongated member segment 104 routing scheme, as indicated by the dashed line on template 605. Certainly the more conventional standoff member 108 (previously shown in FIG. 4) can be used in the kit; in such a case the template might appear as shown illustratively in FIG. 40*c*, where the dashed lines represent printed line on the template for building surface 102 hole drilling. FIG. 41 shows an embodiment of the spacer being used to confirm the gap distance between several adjacent display panels 110.

Closing

While embodiments of the invention have been illustrated and described in detail in the drawings and foregoing description, the same is to be considered as illustrative and not restrictive in character, it being understood that only a selection of embodiments have been shown and described and that all equivalents, changes, and modifications that come within the spirit of the invention as described herein and/or by the following claims are desired to be protected.

What is claimed is:

1. A segmented display array suitable for being positioned on a building surface comprising:
   (a) suspended elongated member segments routed to substantially lie within a plane;
   (b) standoff members distinct from but connected to each suspended elongated member segment, and being suitable for mounting on a building surface;
   (c) an adjustable tensioner coupled to one of said elongated member segments;
   (d) display panels adjacent said elongated member segments, each said display panel comprising a front face and a rear face, wherein each of said front faces is oriented to face outward from the building surface and is visible by a viewer of the display array, and each of said rear faces is oriented to face the building surface; and
   (e) tool-free-releasable retention members affixed to said rear faces and free from contact with said front faces of said display panels, wherein said tool-free-releasable retention members releasably retain said elongated member segments.

2. The display array of claim 1 in which said tool-free-releasable retention members are finger-releasable.

3. The display array of claim 1 in which said tool-free-releasable retention members are clamps.

4. The display array of claim 1 in which said tool-free-releasable retention members are affixed to said display panels by bonding.

5. The display array of claim 1 in which said tool-free-releasable retention members undergo elastic deformation both when they transition from a state of retaining said elongated member segments to a state of release of said elongated member segments, and when they transition from a state of release of said elongated member segments to a state of retaining said elongated member segments.

6. The display array of claim 1 in which said elongated member segments are selected from the group consisting of cable, wire, rope, thread, string, cord, monofilament, tubing, bars and rods.

7. The display array of claim 6 in which said elongated member segments are flexible and selected from the group consisting of cable, wire, rope, thread, string, cord, and monofilament.

8. The display array of claim 7 in which there is at least one panel where an associated suspended elongated member segment passes from that panel to another panel before reaching a standoff member.

9. The display array of claim 7 in which every panel has an associated suspended elongated member segment that passes from that panel to another panel before reaching a standoff member.

10. The display array of claim 1 additionally comprising images on said display panels that are correlated so that one display panel has an image different from another one, but together they form a part of a larger coherent image.

11. The display array of claim 10 comprising at least 6 display panels.

12. The display array of claim 11 additionally comprising images on each of said 6 display panels that are correlated so that each of said 6 display panels has an image different from several other of said display panels, but together they form a part of a larger coherent image.

13. A kit for installing a segmented display array comprising:
   a container;
   4 elongated member segments contained in the container;
   standoff members contained in the container suitable for suspending said elongated member segments away from a building surface;
   an adjustable tensioner adapted to couple to one of said elongated member segments;
   6 display panels contained in the container, each having two opposite faces; and
   tool-free-releasable retention members contained in the container, each affixed to one face of said display panels and free from contact with the corresponding opposite face, for securing said display panels to said elongated member segments.

14. The kit of claim 13 in which said tool-free-releasable retention members are finger releasable.

15. The kit of claim 13 in which said tool-free-releasable retention members are clamps.

16. The kit of claim 13 additionally comprising a template for assisting the positioning of said standoff members on a building surface.

17. The kit of claim 13 in which said tool-free-releasable retention members are affixed to said display panels by bonding.

18. A segmented display array suitable for being positioned on a building surface comprising:
   (a) suspended elongated member segments routed to substantially lie within a plane;
   (b) standoff members distinct from but connected to each suspended elongated member segment, and being suitable for mounting on a building surface;
   (c) an adjustable tensioner coupled to one of said elongated member segments;
   (d) four display panels adjacent said elongated member segments; and
   (e) finger-releasable clamps which permanently couple to each of said display panels and releasably clamp to said elongated member segments.

19. A segmented display array suitable for being positioned on a building surface comprising:
   (a) suspended elongated member segments routed to substantially lie within a plane;
   (b) standoff members distinct from but connected to each suspended elongated member segment, and being suitable for mounting on a building surface;
   (c) an adjustable tensioner coupled to one of said elongated member segments;
   (d) display panels adjacent said elongated member segments; and
   (e) tool-free-releasable retention members which are securely bonded to each of said display panels and releasably retain said elongated member segments.

20. The display array of claim 19 in which said tool-free-releasable retention members undergo elastic deformation both when they transition from a state of retaining said elongated member segments to a state of release of said elongated member segments, and when they transition from a state of release of said elongated member segments to a state of retaining said elongated member segments.

21. The display array of claim 20 in which said elongated member segments are flexible and selected from the group consisting of cable, wire, rope, thread, string, cord, and monofilament.

22. The display array of claim 19 additionally comprising images on said display panels that are correlated so that one display panel has an image different from another one, but together they form a part of a larger coherent image.

23. A segmented display array suitable for being positioned on a substantially vertical building surface comprising:
  (a) suspended elongated member segments routed to substantially lie within a plane a horizontal distance away from the building surface;
  (b) standoff members distinct from but connected to each suspended elongated member segment, being suitable for mounting on a building surface;
  (c) an adjustable tensioner coupled to one of said elongated member segments;
  (d) display panels adjacent said elongated member segments; and
  (e) tool-free-releasable retention members which securely couple to each of said display panels, wherein said tool-free-releasable retention members releasably retain said elongated member segments.

* * * * *